US012604617B2

(12) United States Patent
Lee et al.

(10) Patent No.: US 12,604,617 B2
(45) Date of Patent: Apr. 14, 2026

(54) DISPLAY DEVICE INCLUDING PROTECTIVE MEMBER AND METHOD OF MANUFACTURING THE SAME

(71) Applicant: SAMSUNG DISPLAY CO., LTD., Yongin-si (KR)

(72) Inventors: Jung Kyu Lee, Incheon (KR); Kyu Ho Jung, Osan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 543 days.

(21) Appl. No.: 18/094,920

(22) Filed: Jan. 9, 2023

(65) Prior Publication Data

US 2023/0232666 A1    Jul. 20, 2023

(30) Foreign Application Priority Data

Jan. 18, 2022    (KR) ........................ 10-2022-0007028

(51) Int. Cl.
H10K 59/124        (2023.01)
H10K 59/12         (2023.01)
H10K 59/80         (2023.01)

(52) U.S. Cl.
CPC ....... H10K 59/124 (2023.02); H10K 59/1201 (2023.02); H10K 59/871 (2023.02)

(58) Field of Classification Search
CPC ............ H10K 59/124; H10K 59/1201; H10K 59/871
USPC ........................................ 257/40, 59, 91, 99
See application file for complete search history.

(56) References Cited

U.S. PATENT DOCUMENTS

| | | | |
|---|---|---|---|
| 10,392,534 B2 | 8/2019 | Won et al. | |
| 10,939,547 B2 | 3/2021 | Lee et al. | |
| 2019/0269011 A1* | 8/2019 | Lee ...................... | H05K 3/0014 |
| 2021/0157367 A1* | 5/2021 | Wu .......................... | B32B 7/02 |
| 2021/0408471 A1* | 12/2021 | Xiao ................... | H10K 59/122 |

FOREIGN PATENT DOCUMENTS

| | | |
|---|---|---|
| KR | 10-2017-0112790 A | 10/2017 |
| KR | 10-2018-0079094 A | 7/2018 |
| KR | 10-2019-0102123 A | 9/2019 |
| KR | 10-2020-0120784 A | 10/2020 |
| KR | 10-2020-0145934 A | 12/2020 |
| KR | 10-2021-0037766 A | 4/2021 |

* cited by examiner

*Primary Examiner* — Eric W Jones
(74) *Attorney, Agent, or Firm* — Womble Bond Dickinson (US) LLP

(57)        ABSTRACT

A display device and a method of manufacturing a display device are provided. A display device includes a display panel including a first pixel area, and a second pixel area including a plurality of protruding patterns protruded outward from the first pixel area at a corner portion having both a curvature of left or right side and a curvature of upper or lower side of the display device, and a cut-out portion defined by a space between the plurality of protruding patterns, and a protective member on a lower surface of the display panel includes a first protective area overlapping with the first pixel area of the display panel in a thickness direction, and a second protective area overlapping with the second pixel area of the display panel in the thickness direction, and a density per unit volume of the second protective area is greater than that of the first protective area.

12 Claims, 22 Drawing Sheets

DA: FS, SS, CS

SUB: PXA1, PXA2, LA
PXA1: MS, BS

BS1    BL1             A

PXA1

SUB                   MS

PXA2

CRP

B

BL2

BS2

CG

CP

LA

DR2

DR3   DR1

PX1

EA3 EA2 EA4 EA1

B

II →

II' →

PXA1

DAM1

PX2

EA3"
EA2"
EA1"

III

III'

DAM2

180

PXA2

RC

CP

LA

CG

PX3 : ST3, 370
EML : 180, 370

PX3 : ST3, 370
EML : 180, 370

PROL: PROL1, PROL2

DISPLAY DEVICE INCLUDING PROTECTIVE MEMBER AND METHOD OF MANUFACTURING THE SAME

CROSS-REFERENCE TO RELATED APPLICATION

This application claims priority to and the benefit of Korean Patent Application No. 10-2022-0007028 filed on Jan. 18, 2022 in the Korean Intellectual Property Office, the entire content of which is herein incorporated by reference.

BACKGROUND

1. Field

Aspects of embodiments of the present disclosure relate to a display device and a method of manufacturing the same.

2. Description of the Related Art

With the advancement of the information age, the demand for a display device for displaying an image has increased with various forms. For example, the display device has been applied to various electronic devices, such as a smartphone, a digital camera, a laptop computer, a navigator, a smart watch, and a smart television.

Various types of display devices, such as a liquid crystal display (LCD) device and an organic light emitting display (OLED) device, have been used. Among the display devices, the organic light emitting display device displays an image by using an organic light emitting element that generates light by recombination of electrons and holes. The organic light emitting display device includes a plurality of transistors that provide a driving current to the organic light emitting element.

As the display device is applied to various electronic devices, display devices having various designs have been desired. For example, the display device may display an image on a front surface, bending portions bent from four edges of the front surface, and corner portions disposed between the respective bending portions.

SUMMARY

According to an aspect of embodiments of the present disclosure, a display device is provided in which a lamination defect of the display device having a corner portion in a simple structure may be prevented or substantially prevented from occurring.

According to another aspect of embodiments of the present disclosure, a method of manufacturing a display device is provided which may prevent or substantially prevent a display panel and a cover window from being in line contact with each other during a lamination process of the display device.

However, aspects of the present disclosure are not limited to those mentioned above, and additional aspects of the present disclosure, which are not mentioned herein, will be clearly understood by those skilled in the art from the following description of the present disclosure.

According to one or more embodiments of the disclosure, a display device comprises a display panel including a first pixel area, and a second pixel area including a plurality of protruding patterns protruded outward from the first pixel area at a corner portion having both a curvature of left or right side and a curvature of upper or lower side of the display device, and a cut-out portion defined by a space between the plurality of protruding patterns, and a protective member on a lower surface of the display panel includes a first protective area overlapping with the first pixel area of the display panel in a thickness direction, and a second protective area overlapping with the second pixel area of the display panel in the thickness direction, and a density per unit volume of the second protective area is greater than that of the first protective area.

The protective member may have a heat shrinkage characteristic of 70% to 90% in an environment of 80° C. to 100° C.

An upper surface of the protective member may be directly in contact with the lower surface of the display panel.

A distance between molecules of the second protective area of the protective member may be shorter than that of the first protective area.

The display device may further comprise a cover window on an upper surface of the display panel, and a guide member is on the lower surface of the protective member, wherein the protective member includes polydimethylsiloxane or elastic polyurethane.

A heat shrinkage characteristic of the protective member may be greater than that of the protective member.

According to one or more embodiments of the disclosure, a display device comprises a display panel including a first pixel area, and a second pixel area including a plurality of protruding patterns protruded outward from the first pixel area at a corner portion having both a curvature of left or right side and a curvature of upper or lower side of the display device, and a cut-out portion defined by a space between the plurality of protruding patterns, and a protective member on a lower surface of the display panel, wherein the protective member includes polyester.

The protective member may include a first protective area overlapping with the first pixel area of the display panel in a thickness direction, and a second protective area overlapping with the second pixel area of the display panel in the thickness direction, and both the first protective area and the second protective area include polyester.

The display device may further comprise a cover window on an upper surface of the display panel, and an auxiliary protective member on a lower surface of the protective member, being directly in contact with the first protective area, having a cut octagonal shape in an area corresponding to the second protective area, and including polyethylene terephthalate.

The protective member may include a first protective area overlapping with the first pixel area of the display panel in a thickness direction, and a second protective area overlapping with the second pixel area of the display panel in the thickness direction, the first protective area includes polyethylene terephthalate, and the second protective area includes polyester.

A portion of the second protective area, which includes polyester, may have a plurality of rod shapes protruded outward from the first protective area, and another portion of the second protective area except the portion including polyester includes polyethylene terephthalate.

The portion of the second protective area, which includes polyester, may be located on a lower surface of the cut-out portion, and the another portion of the second protective area except the portion including polyester is located on a lower surface of the protruding pattern.

The second protective area may have a heat shrinkage characteristic greater than that of the first protective area.

According to one or more embodiments of disclosure, a method of manufacturing a display device comprises providing a display panel, a protective member on a lower surface of the display panel, and a guide member on a lower surface of the protective member and having a shape in which upper and lower sides and left and right sides are protruded, pre-deforming the display panel by applying a force to the protruded upper and lower sides and left and right sides of the guide member, and heat-shrinking at least one of the protective member and the guide member by irradiating light emitted from a light emitting diode (LED) to a corner portion having both a curvature of upper or lower side and a curvature of left or right side of the display device.

The protective member may include polyester, and the heat-shrinking may include shrinking the display panel coupled to the protective member as the protective member is heat-shrunk.

The method of manufacturing a display device may further comprise covering a cover window on an upper surface of the display panel after the heat-shrinking.

The method of manufacturing a display device may further comprise removing the guide member by irradiating ultraviolet rays to the guide member after the covering of the cover window.

The guide member may include polyester, and the protective member may include polydimethylsiloxane or elastic polyurethane, the heat-shrinking may include shrinking the display panel and the protective member, which are coupled to the guide member, as the guide member is heat-shrunk, and the method may further comprise covering a cover window on an upper surface of the display panel after the heat-shrinking.

The method of manufacturing a display device may further comprise removing the guide member by irradiating ultraviolet rays to the guide member after the covering of the cover window.

The method of manufacturing a display device may further comprise cutting the protruded upper and lower sides and left and right sides of the guide member after the covering of the cover window.

According to an aspect, in the display device and the method of manufacturing the same according to one or more embodiments, a shape of a corner portion of a display panel may be matched with that of a corner portion of a cover window to prevent or substantially prevent a line contact defect of the display panel and the cover window from occurring. As a result, a lamination defect of the display device may be prevented or substantially prevented from occurring, whereby visibility of the display device may be improved.

However, aspects and effects according to embodiments of the present disclosure are not limited to those mentioned above and more various aspects and effects are included in or will be apparent from the following description of the present disclosure.

DETAILED DESCRIPTION

The present invention will now be described more fully herein with reference to the accompanying drawings, in which some embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art.

It is also to be understood that when a layer or substrate is referred to as being "on" another layer or substrate, it may be directly on the other layer or substrate, or one or more intervening layers or substrates may also be present. The same reference numbers indicate the same components throughout the specification.

It is to be understood that, although the terms "first," "second," etc. may be used herein to describe various elements, these elements should not be limited by these terms. These terms are used to distinguish one element from another element. For instance, a first element discussed below could be termed a second element without departing from the teachings of the invention. Similarly, the second element could also be termed a first element.

Unless otherwise defined, all terms (including technical and scientific terms) used herein have the same meaning as commonly understood by one of ordinary skill in the art to which the inventive concept pertains. It is also to be understood that terms defined in commonly used dictionaries should be interpreted as having meanings consistent with the meanings in the context of the related art, and they are not interpreted in an ideal or overly formal sense, unless expressly defined herein.

Herein, some embodiments of the disclosure will be described in further detail with reference to the accompanying drawings.

Figure 1:
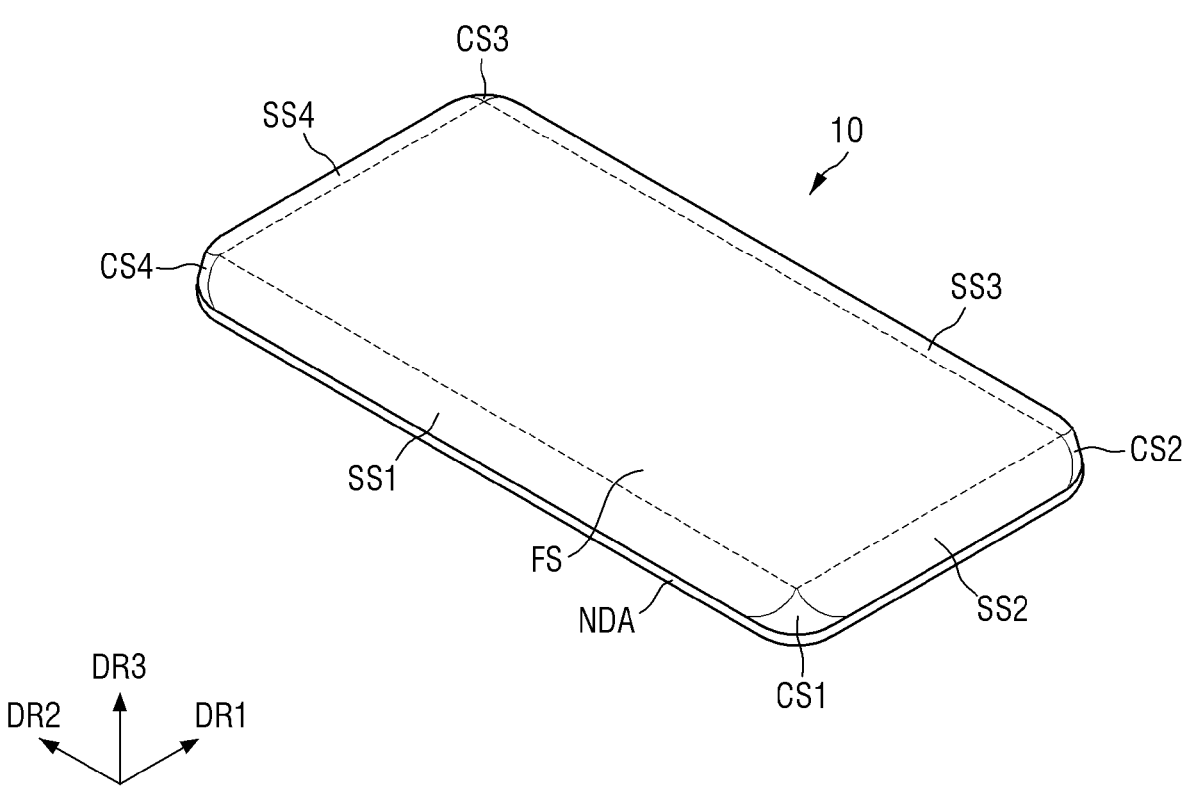
FIG. 1 is a perspective view illustrating a display device according to an embodiment of the present disclosure.
Figure 2:
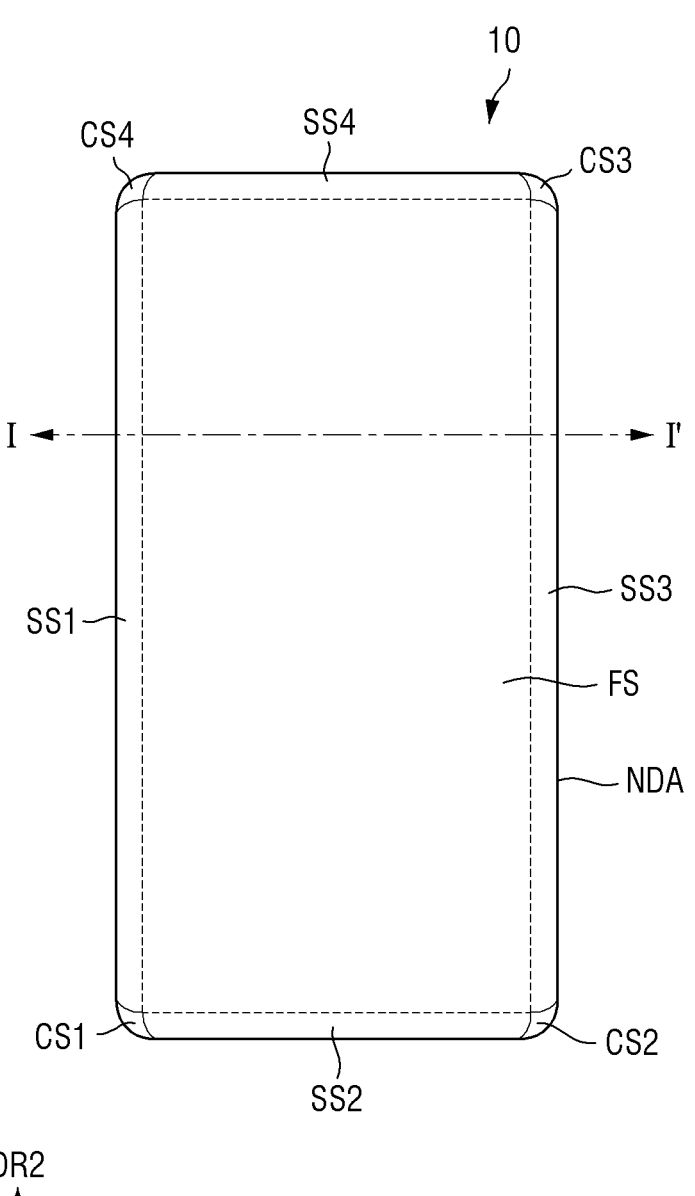
FIG. 2 is a plan view illustrating the display device of FIG. 1.

FIG. 1 is a perspective view illustrating a display device according to an embodiment of the present disclosure; and FIG. 2 is a plan view illustrating the display device of FIG. 1.

Referring to FIGS. 1 and 2, a display device 10 according to an embodiment displays an image through a display area, which will be described later, and may include various devices, each of which includes a display area. For example, the display device 10 according to an embodiment of the present disclosure may be applied to a smartphone, a mobile phone, a personal computer (PC), a personal digital assistant (PDA), a portable multimedia player (PMP), a television, a game machine, a wrist watch type electronic device, a head mounted display, a monitor of a personal computer, a laptop computer, a vehicle navigator, a vehicle dashboard, a digital camera, a camcorder, an outdoor signboard, an electronic display board, medical devices, test devices, various home appliances, such as a refrigerator and a washing machine, or a device for Internet of things (IoT).

In the present disclosure, in a plane, a short side of the display device 10 may be extended in a direction parallel with a first direction DR1, and a long side of the display device 10 may be extended in a direction parallel with a second direction DR2. For example, the first direction DR1 and the second direction DR2 cross each other to be perpendicular to each other, and the first direction DR1 in a plan view may be a horizontal direction of the display device 10, and the second direction DR2 in a plan view may be a vertical direction of the display device 10. A third direction DR3 is a direction perpendicular to the first direction DR1 and the second direction DR2, and, for example, the third direction DR3 may be a thickness direction of the display device 10.

The display device 10 may include a display area DA and a non-display area NDA.

The display area DA may display an image. The display area DA may include pixels and/or light emission areas. The display area DA may include a front portion FS, side portions SS (SS1, SS2, SS3, and SS4), and corner portions CS (CS1, CS2, CS3, and CS4).

The front portion FS may be substantially flat in the entire area, but is not limited thereto. The front portion FS may include a convex or concave shape in at least a partial area in the thickness direction (third direction DR3). In an embodiment, the front portion FS may include a rectangular shape having a short side in the first direction DR1 and a long side in the second direction DR2. In an embodiment, the front portion FS may have a polygonal shape with rounded corners in a plane. For example, as shown in FIG. 1, the front portion FS may have a rectangular shape with rounded corners, but is not limited thereto.

The side portions SS (SS1, SS2, SS3, and SS4) may be extended outwardly from an edge of the front portion FS and then bent at an angle (e.g., a predetermined angle). For example, the side portions SS may be bent at an angle of at least 90° and less than 180° with respect to the front portion FS. When the front portion FS includes a planar rectangular shape, the side portions SS may include a first side portion SS1 and a third side portion SS3, which are extended from the front portion FS to one side and another side of the first direction DR1, and may include a second side portion SS2 and a fourth side portion SS4, which are extended from the front portion FS to one side and another side of the second direction DR2. In an embodiment, the first to fourth side portions SS1, SS2, SS3, and SS4 may be substantially the same as one another in their functions and configurations except for their positions.

A side of each of the side portions SS (SS1, SS2, SS3, and SS4) may have a planar round shape, but is not limited thereto. For example, one side and the other side of the first side portion SS1 in the second direction DR2 may have a planar round shape, but are not limited thereto.

The first to fourth side portions SS1, SS2, SS3 and SS4 may be extended from the front portion FS to include a curvature (e.g., a predetermined curvature), and may have a round shape. The first to fourth side portions SS1, SS2, SS3, and SS4 may have a shape convex toward the outside of the display device 10. For example, the first side portion SS1 may include a first curvature, and the second side portion SS2 may include a second curvature. The third side portion SS3 may include a third curvature, and the fourth side portion SS4 may include a fourth curvature. The first to fourth curvatures may be the same as one another, but are not limited thereto, and the first to fourth curvatures may be different from one another, or only some of the first to fourth curvatures may be the same as each other.

Among portions outwardly bent from the front portion FS of the display device 10, portions between adjacent side portions SS (SS1, SS2, SS3, and SS4) will be defined as the corner portions CS. The first to fourth side portions SS1, SS2, SS3, and SS4 may be spaced apart from one another in at least a partial area at an interval (e.g., a predetermined interval). The corner portions CS (CS1, CS2, CS3, and CS4) may be disposed in areas where the first to fourth side portions SS1, SS2, SS3, and SS4 are spaced apart from one another.

For example, a first corner portion CS1 may be disposed between the first side portion SS1 and the second side portion SS2, a second corner portion CS2 may be disposed between the second side portion SS2 and the third side portion SS3, a third corner portion CS3 may be disposed between the third side portion SS3 and the fourth side portion SS4, and a fourth corner portion CS4 may be disposed between the fourth side portion SS4 and the first side portion SS1. In an embodiment, the first to fourth corner portions CS1, CS2, CS3, and CS4 may be substantially the same as one another in their functions and configurations except for their positions.

Each of the first to fourth corner portions CS1, CS2, CS3, and CS4 includes the curvatures of the side portions adjacent thereto, and may have a round shape. For example, the first corner portion CS1 may be disposed between the first side portion SS1 and the second side portion SS2. In this case, the first corner portion CS1 may include a double curvature that includes a first curvature of the first side portion SS1 and a second curvature of the second side portion SS2. The description of the first corner portion CS1 described above may be also applied to the second to fourth corner portions CS2, CS3, and CS4.

In an embodiment, a pixel may be disposed in the corner portion CS as well as the front portion FS and the side portion SS of the display device 10, and an image may be displayed therein. Therefore, when the display device 10 is viewed from a front surface, a user may recognize that the image is displayed in the entire area of the display device 10. In other words, the user may recognize that a bezel does not exist substantially, and may be provided with a more immersive image.

No display may be made in the non-display area NDA. The non-display area NDA may not include pixels or light emission areas. Signal lines or scan drivers for driving pixels or light emission areas may be disposed in the non-display area NDA. In an embodiment, the non-display area NDA may be disposed to surround the display area DA. The non-display area NDA may be disposed outside the front portion FS and the side portion SS and outside the corner portion CS. The non-display area NDA may constitute a bezel area of the display device 10.

Figure 3:
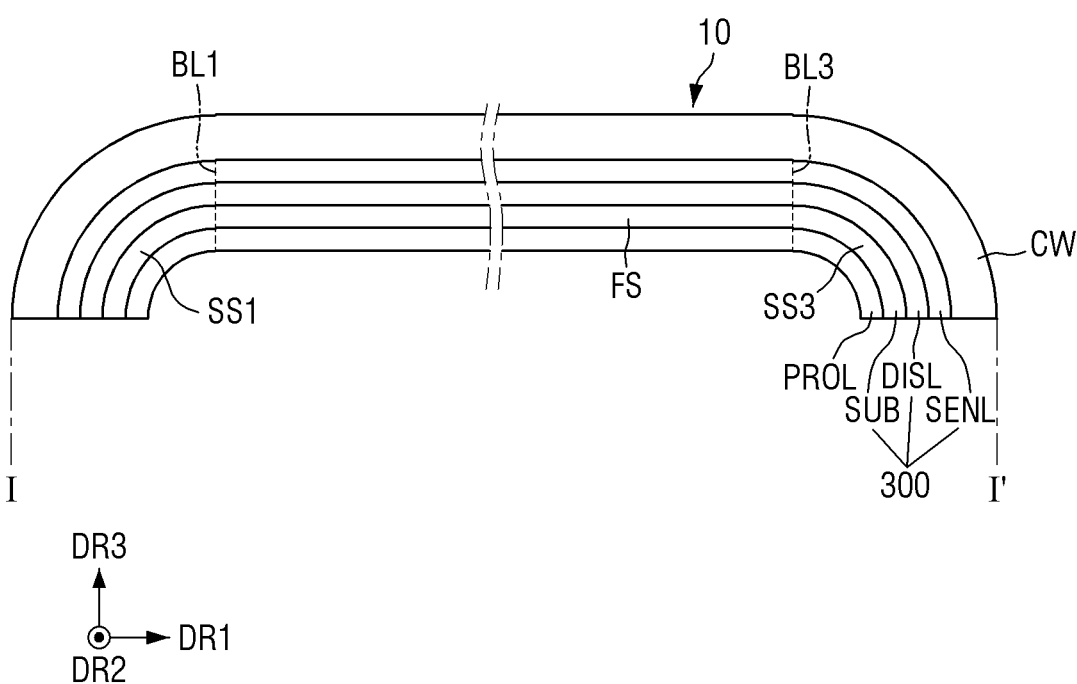
FIG. 3 is a cross-sectional view illustrating an example of a display panel taken along the line I-I' of FIG. 2.

FIG. 3 is a cross-sectional view illustrating an example of a display panel taken along the line I-I' of FIG. 2.

Referring to FIG. 3, in an embodiment, the display device 10 may include a protective member PROL, a substrate SUB, a display layer DISL, a sensor layer SENL, and/or a cover window CW.

Figure 5:
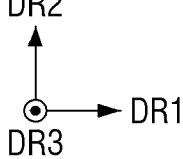
FIG. 5 is an enlarged view of a region "A" of FIG. 4.

The protective member PROL may protect a lower surface of the display panel 300 from the outside, and may help maintain a shape of the display panel 300 having a cut-out portion CG (see FIG. 5).

The protective member PROL may be made of a material having elasticity. A corner portion of a display device 10 has a double curvature having both a curvature of left or right side and a curvature of upper or lower side, such that strain may be applied thereto. As the protective member PROL of a material having elasticity is used, the strain concentrated on the corner portion may be mitigated. Herein, the left, right, upper and lower sides refer to four sides of a surface parallel to a surface defined by the first direction DR1 and the second direction DR2.

The protective member PROL may include a material that is shrunk in a particular temperature environment. For example, the protective member PROL may include a stretched polyester. When heat is applied to the protective member PROL that includes the stretched polyester, the protective member PROL may be shrunk. In an embodiment, when heat having a temperature of 80° C. to 100° C. is applied to the protective member PROL for about 10 seconds by using LED light, the protective member PROL may exhibit a shrinkage characteristic of 70% or more. For example, when heat having a temperature of 90° C. is applied to the protective member PROL for 10 seconds by using the LED light, the protective member PROL may exhibit a shrinkage characteristic of 75%. The protective member PROL may be shrunk together with other layers that are adhered to upper and lower surfaces of the protective member PROL. In addition, when the protective member PROL is shrunk, a distance between molecules is reduced in the shrunk portion, whereby the distance between molecules in the portion shrunk by heat in the protective member PROL may be shorter than a distance between molecules in another portion that is not shrunk as heat is not applied to the other portion. Therefore, the protective member PROL shrunk by heat may have a higher density per unit volume than the protective member that is not shrunk as heat is not applied thereto.

The substrate SUB may be disposed on the protective member PROL. A coupling layer (401 of FIG. 8) may be disposed between the protective member PROL and the substrate SUB. The coupling layer will be described later.

The substrate SUB may be formed of an insulating material, such as a polymer resin, glass, or the like. For example, the substrate SUB may include polyimide. In this case, the substrate SUB may be a flexible substrate SUB capable of being subjected to bending, folding, rolling, or the like. The substrate SUB may provide a space in which other elements disposed thereon may be positioned, and may serve to support the other elements disposed thereon.

The display layer DISL may be disposed on the substrate SUB. The display layer DISL may include a display area DA (see FIG. 1) and a non-display area NDA (see FIG. 1). Scan lines, data lines, power lines, etc. for driving light emitting elements as well as light emission areas may be disposed in the display area DA of the display layer DISL. A scan driving circuit for outputting scan signals to the scan lines and fan-out lines for connecting the data lines with an integrated driving circuit (IDC) may be disposed in the non-display area NDA of the display layer DISL.

The display layer DISL may include a pixel circuit layer PCL (see FIG. 8) in which thin film transistors are formed, a light emitting element layer EML (see FIG. 8) in which light emitting elements emitting light are disposed in the light emission areas, and an encapsulation layer TFEL (see FIG. 8) for encapsulating the light emitting element layer.

The sensor layer SENL may be disposed on the display layer DISL. The sensor layer SENL may include sensor electrodes. The sensor layer SENL may sense a touch of a person or an object by using the sensor electrodes.

The cover window CW may be disposed on the sensor layer SENL. The cover window CW may be attached onto the sensor layer SENL by a transparent adhesive member such as an optical clear adhesive (OCA) member or an optical transparent resin (OCR) member. The cover window CW may include an inorganic material, such as glass, or may include an organic material, such as a plastic or polymeric material.

Figure 4:
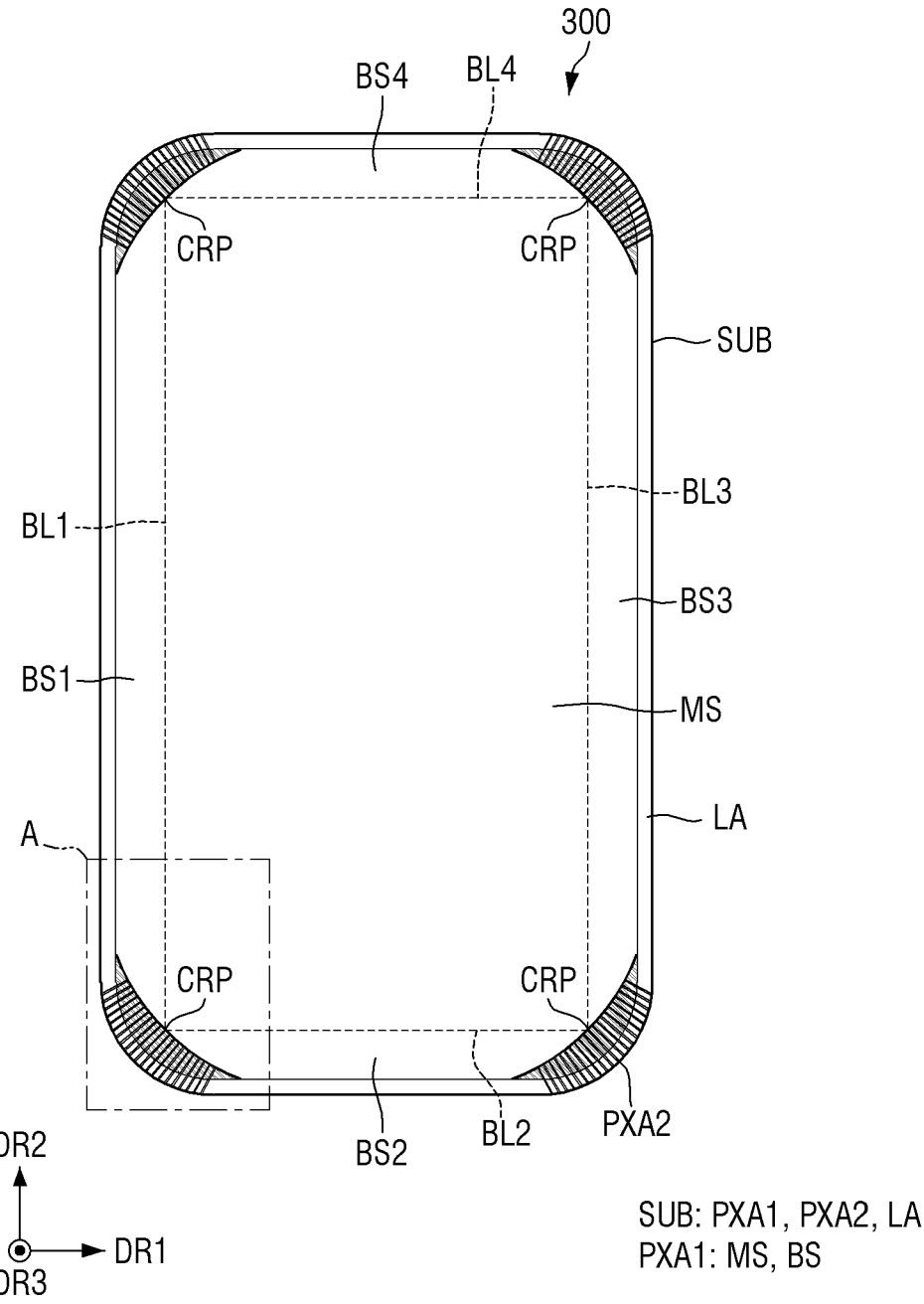
FIG. 4 is a view of a display panel of a display device according to an embodiment of the present disclosure.
Figure 6:
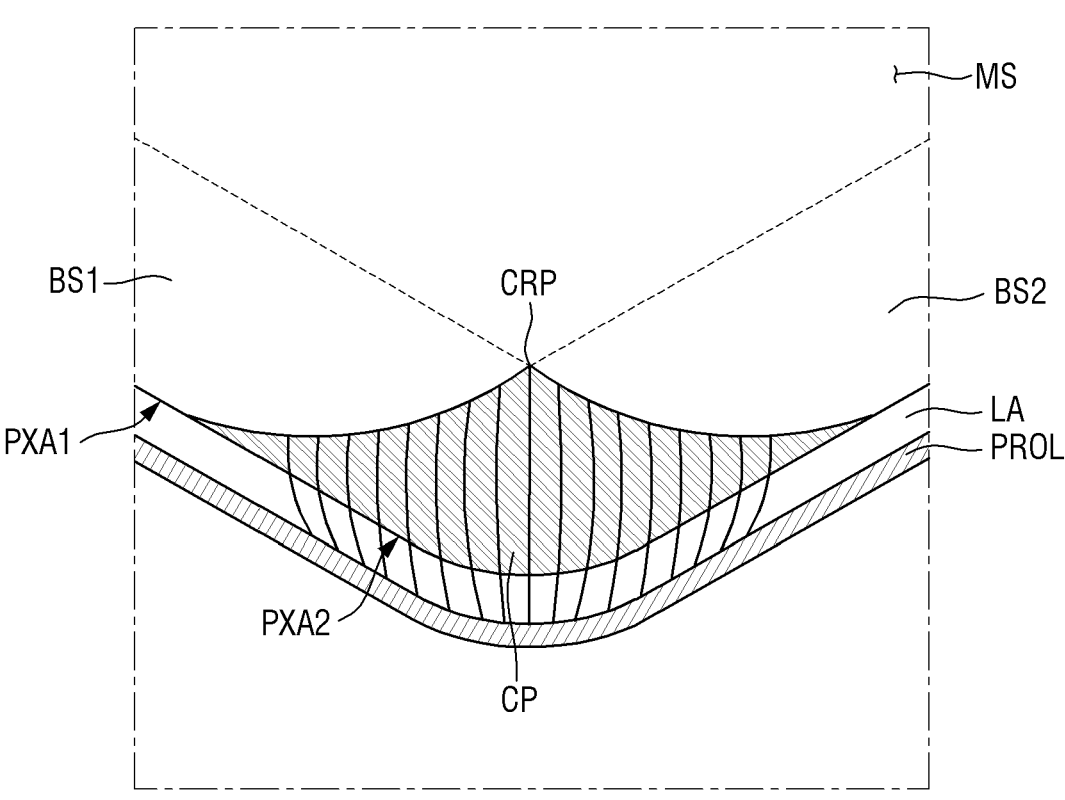
FIG. 6 is a partial perspective view illustrating a display device according to an embodiment of the present disclosure, and illustrates that the region "A" of FIG. 4 is bent.
Figure 6:
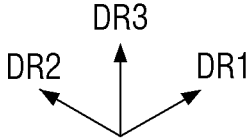

FIG. 4 is a view of a display panel of a display device according to an embodiment of the present disclosure; FIG. 5 is an enlarged view of a region "A" of FIG. 4; and FIG. 6 is a partial perspective view illustrating a display device according to an embodiment of the present disclosure, and illustrating that the region "A" of FIG. 4 is bent.

The display device 10 according to an embodiment of the present disclosure may include a display panel 300.

The display panel 300 may include a substrate SUB.

The substrate SUB may include a first pixel area PXA1, a second pixel area PXA2 and a non-pixel area LA. Each of the first pixel area PXA1 and the second pixel area PXA2 may include a plurality of pixels, and, in the non-pixel area LA, pixels are not disposed, but lines for driving the pixels may be disposed. The first pixel area PXA1 and the second pixel area PXA2 may correspond to the display area DA of the display device 10 of FIG. 1, and the non-pixel area LA may correspond to the non-display area NDA of the display device 10 of FIG. 1. The non-pixel area LA may be disposed outside the first pixel area PXA1 and the second pixel area PXA2, and, in an embodiment, may surround the first pixel area PXA1 and the second pixel area PXA2 in an elevational view.

The first pixel area PXA1 may include a main portion MS and bending portions BS (BS1, BS2, BS3, and BS4). The main portion MS may correspond to the front portion FS of the display device 10 of FIG. 1, and the bending portions BS (BS1, BS2, BS3, and BS4) may correspond to the side portion SS of the display device 10 of FIG. 1. A shape of the main portion MS may substantially correspond to the shape of the front portion FS of the display device 10 of FIG. 1, and a shape of the bending portions BS (BS1, BS2, BS3, BS4) may substantially correspond to the shape of the side portion SS of the display device 10 of FIG. 1.

The bending portions BS (BS1, BS2, BS3, and BS4) may be extended outwardly from an edge of the main portion MS and then bent at an angle (e.g., a predetermined angle). Each of the first to fourth bending portions BS1, BS2, BS3, and BS4 may be extended from the main portion MS, and may be bent along bending lines BL1, BL2, BL3, and BL4. For example, the bending portion BS may be bent at an angle of at least 90° and less than 180° with respect to the main portion MS.

A crossing point CRP of each of the bending lines BL1, BL2, BL3, and BL4 may be positioned between the first pixel area PXA1 and the second pixel area PXA2, or may be positioned on a boundary between the first pixel area PXA1 and the second pixel area PXA2, but is not limited thereto. The crossing point CRP of each of the bending lines BL1, BL2, BL3, and BL4 may be positioned in the first pixel area PXA1, or may be positioned in the second pixel area PXA2.

When the main portion MS includes a planar rectangular shape, the bending portion BS may include a first bending portion BS1 and a third bending portion BS3, which are extended from the main portion MS to one side and the other side of the first direction DR1, and a second bending portion BS2 and a fourth bending portion BS4, which are extended to one side and the other side of the second direction DR2. In an embodiment, the first to fourth bending portions BS1, BS2, BS3, and BS4 may be substantially the same as one another in their functions and configurations except for their positions.

The first to fourth bending portions BS1, BS2, BS3, and BS4 may be extended from the main portion MS and include a curvature (e.g., a predetermined curvature), and may have a round shape. For example, the first bending portion BS1 may include a curvature that is convex toward one side of the first direction DR1 and one side of the third direction DR3. The curvature of the first bending portion BS1 may be substantially the same as the first curvature of the first side portion SS1 of the display device 10 of FIG. 1, but is not limited thereto. Each of the first to fourth bending portions BS1, BS2, BS3, and BS4 may include the same curvature, but is not limited thereto, and the first to fourth bending portions BS1, BS2, BS3, and BS4 may have respective curvatures different from one another.

The first to fourth bending portions BS1, BS2, BS3, and BS4 may have a trapezoidal shape in an elevational view, and, in this case, both sides of the trapezoidal shape may have a round shape. For example, in an elevational view, a length of one side of the first bending portion BS1 extended in the first direction DR1 in the second direction DR2 may be shorter than a length of the other side of the first bending portion BS1 extended in the first direction DR1 in the second direction DR2. In the elevational view, a side connecting both sides of the first bending portion BS1 may be positioned on one side and the other side of the first bending portion BS1 in the second direction DR2. The first bending portion BS1 may have a round shape, but the shape of the first bending portion BS1 is not limited thereto in the elevational view. The description of the first bending portion BS1 may be also applied to the second to fourth bending portions BS2, BS3, and BS4.

The second pixel area PXA2 may be disposed between adjacent bending portions BS (BS1, BS2, BS3, and BS4). In other words, the first to fourth bending portions BS1, BS2, BS3, and BS4 may be spaced apart from each other in at least a partial area at an interval (e.g., a predetermined interval). The second pixel area PXA2 may be disposed in the area where the first to fourth bending portions BS1, BS2, BS3, and BS4 are spaced apart from one another.

For example, the second pixel area PXA2 may be disposed in at least one of between the first bending portion BS1 and the second bending portion BS2, between the second bending portion BS2 and the third bending portion BS3, between the third bending portion BS3 and the fourth bending portion BS4, or between the fourth bending portion BS4 and the first bending portion BS1.

In an embodiment, the second pixel area PXA2 may include a curvature different from that of the bending portion, and may have a round shape. For example, the second pixel area PXA2 positioned between the first bending portion BS1 and the second bending portion BS2 may include a double curvature that includes the curvature of the first bending portion BS1 and the curvature of the second bending portion BS2. A shape of the second pixel area PXA2 may correspond to that of the corner portion CS of the display device 10.

The substrate SUB may include a protruding pattern CP. The protruding pattern CP may be protruded from the first pixel area PXA1 (or base portion) of the substrate SUB. In other words, the protruding pattern CP may be protruded from at least one of the main portion MS and the bending portion BS (BS1, BS2, BS3, and BS4). Adjacent protruding patterns CP may be physically separated from each other in at least a partial area. As described below, each of the protruding patterns CP may be physically separated from an uppermost layer to the substrate SUB, which is a lowermost layer, in at least a partial area.

A cut-out portion CG (or cut-out pattern) may be positioned at a portion where the adjacent protruding patterns CP are physically separated from each other. That is, a space may be provided between the protruding patterns CP adjacent to each other by the cut-out portion CG. Therefore, even though the second pixel area PXA2 has a double curvature, the protruding pattern CP of the second pixel area PXA2 may be stretched and shrunk, and, thus, the strain applied to the second pixel area PXA2 may be reduced by the cut-out portions CG.

Figure 7:
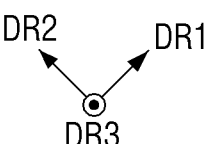
FIG. 7 is an enlarged view of a region "B" of FIG. 5.

FIG. 7 is an enlarged view of a region "B" of FIG. 5.

Referring to FIGS. 4 to 7, the first pixel area PXA1 may include a plurality of first pixels PX1, and the second pixel area PXA2 may include a plurality of second pixels PX2.

Each of the plurality of first pixels PX1 of the first pixel area PXA1 may include a plurality of light emission areas EA1, EA2, EA3, and EA4. For example, each of the plurality of first pixels PX1 may include a first light emission area EA1, a second light emission area EA2, a third light emission area EA3, and a fourth light emission area EA4. The first light emission area EA1, the second light emission area EA2, the third light emission area EA3, and the fourth light emission area EA4 may emit respective colors different from one another, but are not limited thereto. For example, the first light emission area EA1 may emit red light, the third light emission area EA3 may emit blue light, and the second light emission area EA2 and the fourth light emission area EA4 may emit green light.

The first pixel area PXA1 may further include a first dam structure DAM1. The first dam structure DAM1 may be disposed along an edge of the first pixel area PXA1. In an embodiment, the first dam structure DAM1 may surround the plurality of first pixels PX1 of the first pixel area PXA1 in a plane. The first dam structure DAM1 may serve to suppress or prevent an organic layer of the first pixel area PXA1 from overflowing to the outside of the first pixel area PXA1.

Each of the plurality of second pixels PX2 of the second pixel area PXA2 may include a plurality of light emission areas EA1", EA2", and EA3". For example, each of the plurality of second pixels PX2 may include a first light emission area EA1", a second light emission area EA2", and a third light emission area EA3". The first light emission area EA1", the second light emission area EA2", and the third light emission area EA3" may emit light of respective colors different from one another, but are not limited thereto.

The second pixel area PXA2 may further include a second dam structure DAM2. The second dam structure DAM2 may be disposed along an edge of each protruding pattern CP of the second pixel area PXA2. In other words, the second dam structure DAM2 may be disposed on each of the protruding patterns CP, and may surround the plurality of second pixels PX2 disposed on each of the protruding patterns CP. The second dam structure DAM2 may serve to suppress or prevent an organic layer of each protruding pattern CP of the second pixel area PXA2 from overflowing to the outside of each protruding pattern CP of the second pixel area PXA2.

A recess pattern RC may be disposed in the second dam structure DAM2 in each protruding pattern CP of the second pixel area PXA2. An organic layer of each second pixel PX2 of the second pixel area PXA2 may be separated from a dummy organic layer disposed in the recess pattern RC by the recess pattern RC, and the dummy organic layer may suppress or prevent external air and moisture from being permeated into the organic layer of each second pixel PX2 of the second pixel area PXA2. Therefore, reliability of the second pixel PX2 of the second pixel area PXA2 may be improved.

The protruding pattern CP may be protruded from at least one of the main portion MS and the bending portion BS of the first pixel area PXA1 toward the outside of the first pixel area PXA1. The protruding pattern CP may be protruded from the first pixel area PXA1. One end of each protruding pattern CP may be connected to the first pixel area PXA1. The non-pixel area LA may be disposed on another side of opposite to a side of the protruding pattern CP connected to the first pixel area PXA1.

One end of each protruding pattern CP may be connected to the first pixel area PXA1. The other end of each protruding pattern CP may be connected to the non-pixel area LA. In other words, in a partial area of the display panel 300, the first pixel area PXA1 and the non-pixel area LA may be spaced apart from each other with the second pixel area PXA2 interposed therebetween. The protruding pattern CP of the second pixel area PXA2 may be disposed in the space where the first pixel area PXA1 and the non-pixel area LA are spaced apart from each other, and the protruding pattern CP may connect the first pixel area PXA1 with the non-pixel area LA, but the protruding pattern CP is not limited thereto. For example, the other end of each protruding pattern CP may not be connected to the non-pixel area LA, and may be exposed to the outside without being connected to a separate element.

The second pixel area PXA2 may be disposed on the protruding pattern CP between the first pixel area PXA1 and the non-pixel area LA. The non-pixel area LA may be provided for each of the protruding patterns CP, and the non-pixel areas LA provided for the respective protruding patterns CP may be separated from each other and spaced apart from each other in an elevational view.

The other portion of the protruding pattern CP except the portion of the protruding pattern CP connected to the first pixel area PXA1 may be exposed in an elevational view, but is not limited thereto. For example, a first coupling layer 401 (see FIG. 8) for adhering the protective member PROL to the substrate SUB may be disposed between the respective protruding patterns CP. In an embodiment, lengths of the protruding patterns CP protruded from the first pixel area PXA1 may be different from each other. For example, the length of the protruding pattern CP disposed to be adjacent to the bending portions BS (BS1, BS2, BS3, and BS4) may be shorter than the length of the protruding pattern CP disposed at a center of the corner portion, but is not limited thereto. For example, the lengths of the protruding patterns CP may be the same as each other, but the length of the protruding pattern CP disposed to be adjacent to the bending portions BS (BS1, BS2, BS3, and BS4) may be the longest among the lengths of the protruding patterns CP.

An end of the first pixel area PXA1 to which the plurality of protruding patterns CP are protruded may include a curve in an elevational view, and, in this case, the directions in which the respective protruding patterns CP are protruded may be different from each other, but the present disclosure is not limited thereto. The length of the protruding pattern CP protruded from the first pixel area PXA1 may be greater than a width of the protruding pattern CP in a direction perpendicular to the protruded direction.

In an embodiment, the width of each of the protruding patterns CP may be smaller toward the non-pixel area LA from the first pixel area PXA1. In this case, each of the protruding patterns CP may include a planar trapezoidal shape in an elevational view, but is not limited thereto. For example, the width of each of the protruding patterns CP may be constant, but may be greater toward the non-pixel area LA from the first pixel area PXA1.

The plurality of protruding patterns CP may be opposite to each other. In other words, the plurality of protruding patterns CP may be spaced apart from each other with the cut-out portion CG interposed therebetween, and sides of the respective protruding patterns CP may be opposite to each other. The plurality of protruding patterns CP may be partitioned by the cut-out portion CG. An interval between the protruding patterns CP adjacent to each other in an elevational view may be increased toward the non-pixel area LA from the first pixel areas PXA1.

When the protruding patterns CP are bent, the interval between the protruding patterns CP adjacent to each other may be reduced, or the protruding patterns CP adjacent to each other may be directly in contact with each other. When the protruding patterns CP adjacent to each other are directly in contact with each other, a physical interface (or boundary) may be positioned between the protruding patterns CP adjacent to each other, but the present disclosure is not limited thereto. For example, when the protruding patterns CP are bent, the protruding patterns CP adjacent to each other may overlap each other. Further, when the protruding patterns CP are bent, the interval between the second pixels PX2 disposed on the respective protruding patterns CP may be reduced.

In addition, among the plurality of protruding patterns CP, the protruding pattern CP positioned at the outermost portion may be directly in contact with the bending portions BS1, BS2, BS3, and BS4 adjacent thereto during bending. In this case, a physical interface (or boundary) may be positioned between the protruding pattern CP and the first pixel area PXA1 adjacent to the protruding pattern CP and disposed in the bending portions BS1, BS2, BS3, and BS4.

When the protruding pattern CP is bent, the protruding pattern CP may include a curvature of the bending portions BS1, BS2, BS3, and BS4 adjacent thereto, and may have a round shape. In other words, the protruding pattern CP may include a double curvature substantially the same as that of the second pixel area PXA2, and may have a round shape.

Herein, a cross-section of the display panel will now be described.

Figure 8:
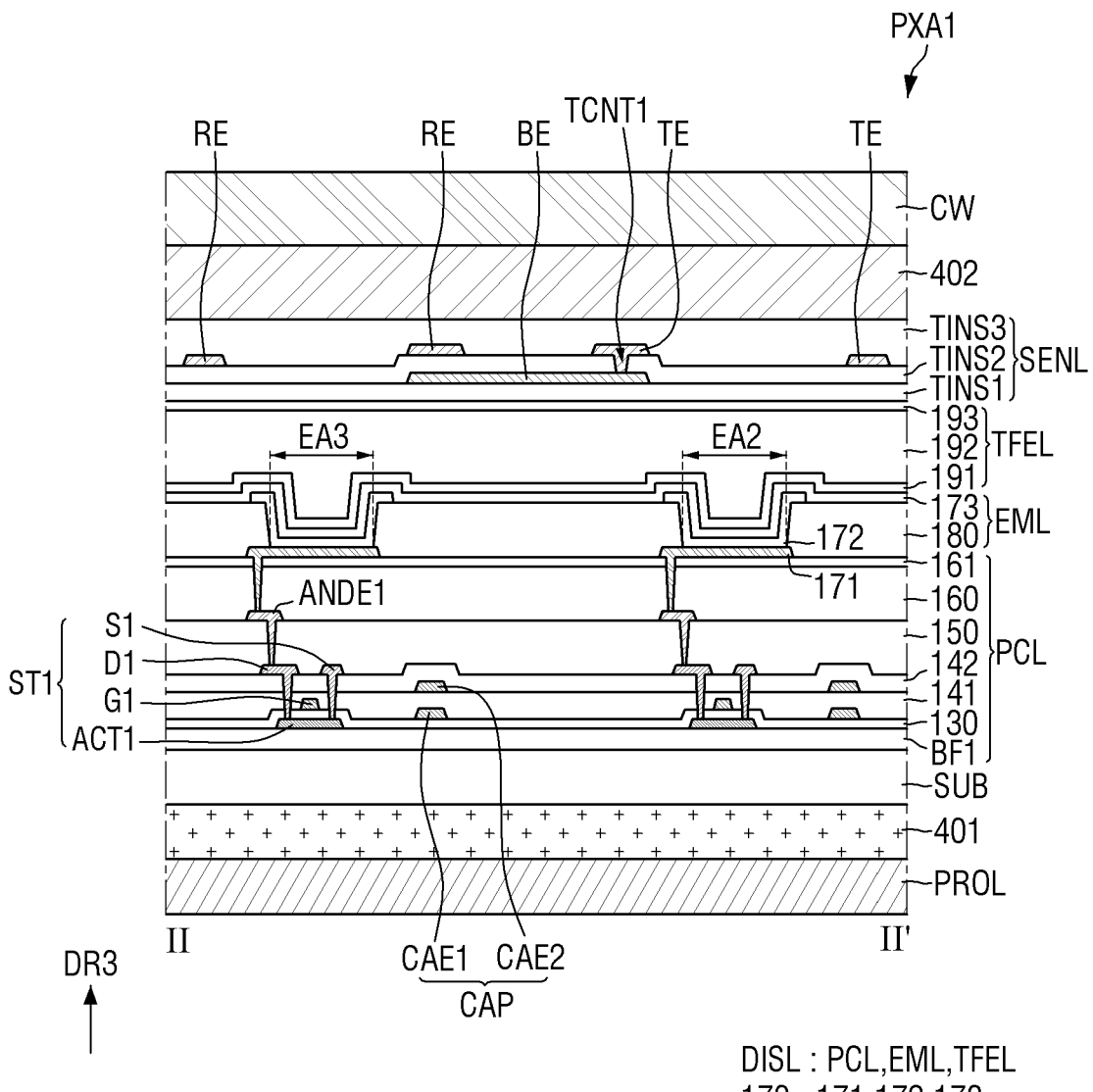
FIG. 8 is a cross-sectional view taken along the line II-II' of FIG. 7.

FIG. 8 is a cross-sectional view taken along the line II-II' of FIG. 7. FIG. 8 illustrates a stacked structure of the first pixel area PXA1.

Referring to FIG. 8, a first coupling layer 401 may be disposed on the protective member PROL, and a substrate SUB may be disposed on the first coupling layer 401. A display layer DISL, which includes a pixel circuit layer PCL, a light emitting element layer EML, and an encapsulation layer TFEL, may be disposed on the substrate SUB, and a sensor layer SENL, which includes driving electrodes TE, sensing electrodes RE, and touch connection electrodes BE, may be disposed on the display layer DISL.

The protective member PROL may protect the lower surface of the display panel 300 (see FIG. 4) from the outside and may help maintain the shape of the display panel 300.

The first coupling layer 401 may adhere the protective member PROL to another element. Therefore, the first coupling layer 401 may be made of a material capable of being adhered to the protective member PROL, and, in an embodiment, a lower surface of the first coupling layer 401 may be directly in contact with an upper surface of the protective member PROL and then adhered to the upper surface of the protective member PROL. In an embodiment, the first coupling layer 401 may be an adhesive layer or a viscosity layer.

The first coupling layer 401 may include a silicon-based optically transparent material, such as a silicon-based optical transparent adhesive (OCA), but is not limited thereto. The substrate SUB may include a flexible substrate capable of being subjected to bending, folding, rolling, and/or stretching as described above.

The pixel circuit layer PCL including first thin film transistors ST1 may be disposed on the substrate SUB. The pixel circuit layer PCL may include a first thin film transistor ST1, a pixel connection electrode ANDE1, a buffer layer BF1, a gate insulating layer 130, a first interlayer insulating layer 141, a second interlayer insulating layer 142, a first planarization layer 150, a second planarization layer 160, and a barrier layer 161.

The buffer layer BF1 may be disposed on the substrate SUB. In an embodiment, the buffer layer BF1 may be formed of a silicon nitride layer, a silicon oxynitride layer, a silicon oxide layer, a titanium oxide layer, or an aluminum oxide layer.

The first thin film transistor ST1 may be disposed on the buffer layer BF1. The first thin film transistor ST1 may include a first active layer ACT1, a first gate electrode G1, a first source electrode S1, and a first drain electrode D1.

The first active layer ACT1 of the first thin film transistor ST1 may be disposed on the buffer layer BF1. The first active layer ACT1 may include a silicon semiconductor, such as any of polycrystalline silicon, monocrystalline silicon, low temperature polycrystalline silicon, and amorphous silicon. An area of the first active layer ACT1, which overlaps the first gate electrode G1 in the third direction DR3, may be defined as a channel area. An area of the first active layer ACT1, which does not overlap the first gate electrode G1 in the third direction DR3, may be defined as a conductive area. The conductive area of the first active layer ACT1 may have conductivity by doping ions or impurities in the silicon semiconductor.

The gate insulating layer 130 may be disposed on the first active layer ACT1 of the first thin film transistor ST1. The gate insulating layer 130 may be formed of an inorganic layer, for example, a silicon nitride layer, a silicon oxynitride layer, a silicon oxide layer, a titanium oxide layer, or an aluminum oxide layer.

A first capacitor electrode CAE1 and the first gate electrode G1 of the first thin film transistor ST1 may be disposed on the gate insulating layer 130. The first gate electrode G1 of the first thin film transistor ST1 may overlap the first active layer ACT1 in the third direction DR3. The first capacitor electrode CAE1 may overlap a second capacitor electrode CAE2 in the third direction DR3. In an embodiment, the first gate electrode G1 and the first capacitor electrode CAE1 may be formed of a single layer or multiple layers made of any of molybdenum (Mo), aluminum (Al), chromium (Cr), gold (Au), titanium (Ti), nickel (Ni), neodymium (Nd), and copper (Cu), or an alloy of any of these.

The first interlayer insulating layer 141 may be disposed on the first gate electrode G1 and the first capacitor electrode CAE1. The first interlayer insulating layer 141 may be formed of an inorganic layer, for example, a silicon nitride layer, a silicon oxynitride layer, a silicon oxide layer, a titanium oxide layer, or an aluminum oxide layer. The first interlayer insulating layer 141 may include a plurality of inorganic layers.

The second capacitor electrode CAE2 may be disposed on the first interlayer insulating layer 141. The second capacitor electrode CAE2 may overlap the first capacitor electrode CAE1 in the third direction DR3. In an embodiment, the first interlayer insulating layer 141 has a predetermined dielectric constant, and a capacitor may be formed by the first capacitor electrode CAE1, the second capacitor electrode CAE2 and the first interlayer insulating layer 141. In an embodiment, the second capacitor electrode CAE2 may be formed of a single layer or multiple layers made of any of molybdenum (Mo), aluminum (Al), chromium (Cr), gold (Au), titanium (Ti), nickel (Ni), neodymium (Nd), and copper (Cu), or an alloy of any of these.

The second interlayer insulating layer 142 may be disposed on the second capacitor electrode CAE2. The second interlayer insulating layer 142 may be formed of an inorganic layer, for example, a silicon nitride layer, a silicon oxynitride layer, a silicon oxide layer, a titanium oxide layer, or an aluminum oxide layer.

The first source electrode S1 and the first drain electrode D1 of the first thin film transistor ST1 may be disposed on the second interlayer insulating interlayer 142. In an embodiment, the first source electrode S1 and the first drain electrode D1 may be formed of a single layer or multiple layers made of any of molybdenum (Mo), aluminum (Al), chromium (Cr), gold (Au), titanium (Ti), nickel (Ni), neodymium (Nd), and copper (Cu), or an alloy of any of these.

The first source electrode S1 of the first thin film transistor ST1 may be connected to the conductive area disposed on one side of the channel area of the first active layer ACT1 through a contact hole that passes through the gate insulating layer 130, the first interlayer insulating layer 141, and the second interlayer insulating layer 142. The first drain electrode D1 of the first thin film transistor ST1 may be connected to the conductive area disposed on the other side of the channel area of the first active layer ACT1 through the contact hole that passes through the gate insulating layer 130, the first interlayer insulating layer 141, and the second interlayer insulating layer 142.

The first planarization layer 150 may be disposed on the first source electrode S1 and the first drain electrode D1 to planarize a step difference caused by the thin film transistors. The first planarization layer 150 may be formed of an organic layer, such as any of an acrylic resin, an epoxy resin, a phenolic resin, a polyamide resin, and a polyimide resin.

The pixel connection electrode ANDE1 may be disposed on the first planarization layer 150. The pixel connection electrode ANDE1 may be connected to the first source electrode S1 or the first drain electrode D1 of the first thin film transistor ST1 through a contact hole that passes through the first planarization layer 150. In an embodiment, the pixel connection electrode ANDE1 may be formed of a single layer or multiple layers made of any of molybdenum (Mo), aluminum (Al), chromium (Cr), gold (Au), titanium (Ti), nickel (Ni), neodymium (Nd), and copper (Cu), or an alloy of any of these.

The second planarization layer 160 may be disposed on the pixel connection electrode ANDE1. The second planarization layer 160 may be formed of an organic layer, such as any of an acrylic resin, an epoxy resin, a phenolic resin, a polyamide resin, and a polyimide resin.

A barrier layer 161 may be disposed on the second planarization layer 160. In an embodiment, the barrier layer 161 may be formed of a silicon nitride layer, a silicon oxynitride layer, a silicon oxide layer, a titanium oxide layer, or an aluminum oxide layer.

The light emitting element layer EML is disposed on the pixel circuit layer PCL. The light emitting element layer EML may include first light emitting elements 170 and a bank 180.

Each of the first light emitting elements 170 may include a first pixel electrode 171, a first light emitting layer 172, and a first common electrode 173. Each of the light emission areas EA1 (see FIG. 7), EA2, EA3, and EA4 (see FIG. 7) refers to an area where the first pixel electrode 171, the first light emitting layer 172, and the first common electrode 173 are sequentially stacked such that holes from the first pixel electrode 171 and electrons from the first common electrode 173 are combined with each other in the first light emitting layer 172 to emit light. In this case, the first pixel electrode 171 may be an anode electrode, and the first common electrode 173 may be a cathode electrode. In an embodiment, light emitting elements of the first light emission area EA1 and the fourth light emission area EA4 may be substantially the same as that of the third light emission area EA3 shown in FIG. 7.

The first pixel electrode 171 may be disposed on the barrier layer 161. The first pixel electrode 171 may be connected to the pixel connection electrode ANDE1 through a contact hole that passes through the barrier layer 161 and the second planarization layer 160.

In a top emission structure in which light is emitted toward the first common electrode 173 based on the first light emitting layer 172, the first pixel electrode 171 may be formed of a stacked structure (ITO/Al/ITO) of aluminum and indium tin oxide (ITO), in which ITO having a high work function, aluminum for reflecting light, and ITO having high adhesion are stacked.

The bank 180 defines light emission areas EA1, EA2, EA3, and EA4 of pixel electrode. To this end, the bank 180 may be formed to expose a portion of the first pixel electrode 171 on the barrier layer 161. The bank 180 may cover an edge of the first pixel electrode 171. The bank 180 may be formed of an organic layer, such as any of an acrylic resin, an epoxy resin, a phenolic resin, a polyamide resin, and a polyimide resin.

The first light emitting layer 172 is disposed on the first pixel electrode 171. The first light emitting layer 172 may include an organic material to emit light of a color (e.g., a predetermined color). For example, the first light emitting layer 172 may include a hole transporting layer, an organic material layer, and an electron transporting layer. The organic material layer may include a host and a dopant. The organic material layer may include a material that emits light (e.g., predetermined light), and may be formed using a phosphorescent material or a fluorescent material.

The first common electrode 173 is disposed on the first light emitting layer 172. The first common electrode 173 may cover the first light emitting layer 172. In an embodiment, the first common electrode 173 may be a common layer commonly formed for the pixel electrode. In an embodiment, a capping layer may be formed on the first common electrode 173.

In the top emission structure, the first common electrode 173 may serve to lower resistance, and may be formed of a transparent conductive material (TCO) such as ITO and indium zinc oxide (IZO), which may transmit light, magnesium (Mg), silver (Ag), or an alloy of Mg and Ag, which has a low work function, at a thin thickness.

The encapsulation layer TFEL may be formed on the light emitting element layer EML. The encapsulation layer TFEL may include at least one inorganic layer to prevent or substantially prevent oxygen or moisture from being permeated into the light emitting element layer EML. The encapsulation layer TFEL may also include at least one organic layer to protect the light emitting element layer EML from particles.

For example, the thin film encapsulation layer TFEL may include a first encapsulation inorganic layer 191 disposed on the first common electrode 173, an encapsulation organic layer 192 disposed on the first encapsulation inorganic layer 191, and a second encapsulation inorganic layer 193 disposed on the encapsulation organic layer 192. In an embodiment, the first encapsulation inorganic layer 191 and the second encapsulation inorganic layer 193 may be formed of multiple layers in which one or more inorganic layers of a silicon nitride layer, a silicon oxynitride layer, a silicon oxide layer, a titanium oxide layer, and an aluminum oxide layer are alternately stacked. The organic layer may include an acrylic resin, an epoxy resin, a phenolic resin, a polyamide resin, or a polyimide resin.

The sensor layer SENL is disposed on the encapsulation layer TFEL. The sensor layer SENL may include driving electrodes TE, sensing electrodes RE, and touch connection electrodes BE.

A first touch inorganic layer TINS1 may be disposed on the encapsulation layer TFEL. In an embodiment, the first touch inorganic layer TINS1 may be formed of a silicon nitride layer, a silicon oxynitride layer, a silicon oxide layer, a titanium oxide layer, or an aluminum oxide layer.

The touch connection electrodes BE may be disposed on the first touch inorganic layer TINS1. In an embodiment, the touch connection electrodes BE may be formed of a stacked structure (ITO/Al/ITO) of aluminum and ITO.

The second touch inorganic layer TINS2 may be disposed on the touch connection electrodes BE. In an embodiment, the second touch inorganic layer TINS2 may be formed of a silicon nitride layer, a silicon oxynitride layer, a silicon oxide layer, a titanium oxide layer, or an aluminum oxide layer.

The driving electrodes TE and the sensing electrodes RE may be disposed on the second touch inorganic layer TINS2. In order to less reduce luminance of light emitted from the light emission areas EA1, EA2, EA3, and EA4 or prevent or substantially prevent luminance of the light from being reduced by being shielded by the driving electrodes TE and the sensing electrodes RE, the driving electrodes TE and the sensing electrodes RE do not overlap the light emission areas EA1, EA2, EA3, and EA4. In an embodiment, the driving electrodes TE and the sensing electrodes RE may be formed of a stacked structure (Ti/Al/Ti) of aluminum and titanium.

A touch organic layer TINS3 may be disposed on the driving electrodes TE and the sensing electrodes RE. In an embodiment, the touch organic layer TINS3 may include an acrylic resin, an epoxy resin, a phenolic resin, a polyamide resin, or a polyimide resin.

Figure 9:
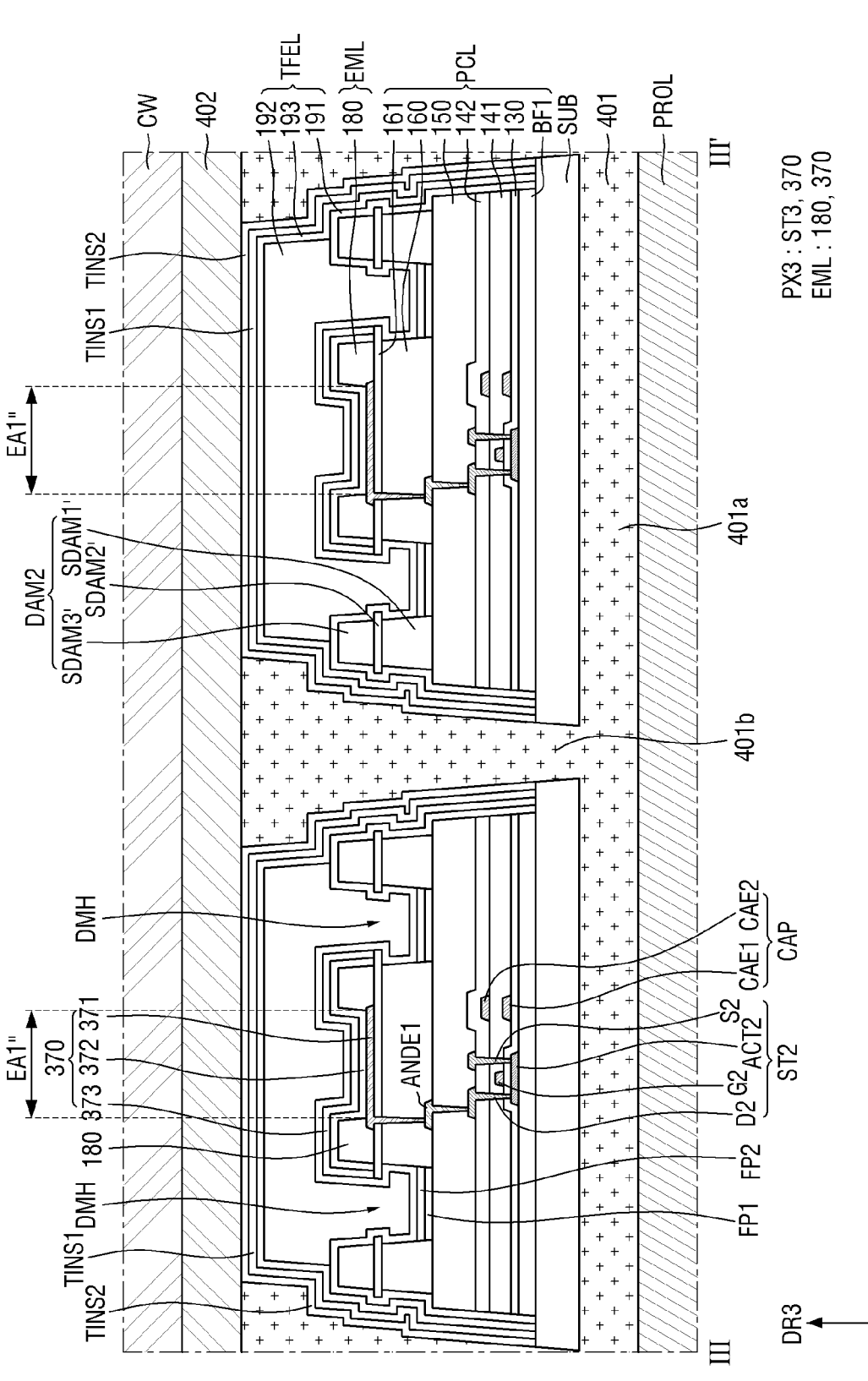
FIG. 9 is a cross-sectional view taken along the line III-III' of FIG. 7.

FIG. 9 is a cross-sectional view taken along the line III-III' of FIG. 7.

Further description of the same configurations as described above with reference to FIG. 8 will be omitted and the description will be based on a difference from FIG. 8.

Referring to FIG. 9, a protective member PROL may be disposed on the lower surface of the display panel 300 (see FIG. 4). The protective member PROL may be disposed to overlap the protruding pattern CP (see FIG. 7) and the cut-out portion CG (see FIG. 7) in the third direction DR3. A second thin film transistor ST2 may include a second active layer ACT2, a second gate electrode G2, a second source electrode S2, and a second drain electrode D2. The second thin film transistor ST2, a second pixel electrode 371, a second light emitting layer 372, and a second common electrode 373 of a second light emitting element 370 may be substantially the same as the first thin film transistor ST1, the first pixel electrode 171, the first light emitting layer 172, and the first common electrode 173 of the first light emitting element 170 described with reference to FIG. 8, and a description thereof will be thus omitted.

The protective member PROL may protect the lower surface of the display panel 300 from the outside, and may help maintain the shape of the display panel 300 having the cut-out portion CG.

The protective member PROL may be formed of a material having elasticity. A corner portion of a display has a curvature of a side portion adjacent thereto, whereby strain may be applied thereto. As the protective member PROL of a material having elasticity is used, the strain concentrated on the corner portion may be mitigated.

As the protective member PROL having elasticity is used, the protective member PROL may be sufficiently shrunk. Therefore, when a guide film applies pressure to the side portion of the display during a manufacturing process of the display, the corner portion may be shrunk to prevent or substantially prevent the protective member PROL of the corner portion from being in line contact with the cover window CW. Also, the corner portion may be sufficiently shrunk due to elasticity of the protective member PROL.

In an embodiment, the protective member PROL may include polyester. The polyester may be shrunk into its original shape when it is subjected to a specific temperature in a stretched state. Therefore, the protective member PROL may include polyester to apply heat to a portion to be shrunk, whereby the protective member PROL may be shrunk. In an embodiment, when heat having a temperature of 80° C. to 100° C. is applied to the protective member PROL by irradiation of LED, the protective member PROL may be shrunk. For example, when the protective member PROL is exposed to a 90° C. environment for 10 seconds by irradiation of LED, the protective member PROL may be shrunk by 75% or more.

In some embodiments, for lamination of the corner portion of the display device 10, heat may be applied only to the corner portion of the protective member PROL to shrink the protective member PROL of the corner portion. As the protective member PROL is shrunk, the first coupling layer 401 and the display panel 300 coupled to the protective member PROL via the first coupling layer 401 may be also shrunk. As described above, the corner portion may be shrunk to adjust the shape of the display panel 300 to be matched with the shape of the cover window CW disposed on the display panel 300. As a result, the cover window CW and the display panel 300 may be prevented or substantially prevented from coming in line contact with each other during lamination of the cover window CW, whereby reliability in lamination of the display device 10, which includes the corner portion, may be improved.

The distance between molecules constituting the protective member PROL may be different for each area. In the protective member PROL, an area disposed to overlap the first pixel area PXA1 (see FIG. 7) of the display panel 300 in the third direction DR3 will be defined as a first protective area, and an area disposed to overlap the second pixel area PXA2 (see FIG. 7) in the third direction DR3 will be defined as a second protective area. In an embodiment, heat may be applied to only the second protective area of the protective member PROL, which corresponds to the corner portion of the display device 10, whereby the second protective area of the protective member PROL may be shrunk. The polyester included in the first protective area of the protective member PROL may be in a stretched state. On the other hand, the second protective area of the protective member PROL may be in a state that the stretched polyester is shrunk by heat and partially returns to its original state. Therefore, the distance between molecules of the second protective area of the protective member PROL may be shorter than that between molecules of the first protective area of the protective member PROL. As a result, the protective member PROL may have a higher density per unit volume in the second protective area than in the first protective area.

In some embodiments, a shape of the upper and/or lower surface of the protective member PROL in the second protective area may differ from that of the upper and/or lower surface of the protective member PROL in the first protective area. For example, the upper surface and/or the lower surface of the protective member PROL in the second protective area may be shrunk by heat, and may be a non-flat shape with the effect of other layers stacked on the upper surface of the protective member PROL.

The first coupling layer 401 may be disposed on the upper surface of the protective member PROL. In an embodiment, the first coupling layer 401 may be disposed to be directly in contact with the protective member PROL to surround all of the upper surface of the protective member PROL at the same thickness, but is not limited thereto. For example, a width of a lower surface of the first coupling layer 401 may be smaller than that of the protective member, such that a portion of the upper surface of the protective member PROL may not be in contact with the first coupling layer 401.

When the protective member PROL is shrunk by heat, and due to an adhesive force between the first coupling layer 401 and the protective member PROL, shear stress is generated on the interface between the protective member PROL and the first coupling layer 401, whereby the first coupling layer 401 may be also shrunk. Also, shear stress is generated between the first coupling layer 401 and components of the display panel 300 stacked on the upper surface of the first coupling layer 401 due to an adhesive force between the first coupling layer 401 and the components of the display panel 300 stacked on the upper surface of the first coupling layer 401, whereby the display panel 300 may be also shrunk. As a result, a shrinkage force of the protective member PROL stacked on a lower surface of the first coupling layer 401 may be transferred to the components of the display panel 300 stacked on an upper surface of the first coupling layer 401 by the first coupling layer 401. A portion of the first coupling layer 401 having a flat shape between the protective member PROL and the protruding pattern CP is defined as a base portion 401*a*, and a portion of the first coupling layer 401 disposed between the protruding patterns CP adjacent to each other in the cut-out portion CG is defined as a protruding portion 401*b*. The base portion 401*a* and the protruding portion 401*b* may be integrally formed in a portion where they are in contact with each other, without a separate interface.

In an embodiment, a lower surface of the base portion 401*a* may cover the entire upper surface of the protective member PROL in the same shape as that of the upper surface of the protective member PROL. In an embodiment, an upper surface of the base portion 401*a* may be directly in contact with the lower surface of the protruding pattern CP and the protruding portion 401*b*. Therefore, in an embodiment, the base portion 401*a* may cover the entire lower surface of the protruding pattern CP. In an embodiment, a side of the protruding portion 401*b* may cover the entire side of the protruding pattern CP, and may fill the entire space formed by the cut-out portion CG of the display panel 300. Therefore, the first coupling layer 401 may have a shape complementary to an uneven shape of the side of the protruding pattern CP in the area where the protruding portion 401*b* and the protruding pattern CP overlap each other in the third direction DR3, but is not limited thereto. For example, in a manufacturing process of the display device 10, the protruding portion 401*b* covers a portion of the protruding pattern CP, and as the cut-out portion CG becomes narrow while the corner portion is shrunk by heat, the protruding portion 401*b* fills the remaining space except a portion above the space formed by the cut-out portion CG, and a partial space that is not filled with the first coupling layer 401 in the space formed by the cut-out portion CG may be filled with a second coupling layer 402. In addition, the side of the protruded portion 401*b* and the side of the protruding pattern CP may be directly in contact with each other in most areas, but may be spaced apart from each other in some areas.

In an embodiment, the upper surface of the protruding portion 401*b* disposed in the cut-out portion CG may be directly in contact with the lower surface of the second coupling layer 402, and may have a planar shape the same as that of the lower surface of the second coupling layer 402.

The protruding pattern CP may be disposed on the base portion 401*a* of the first coupling layer 401. The second pixel area PXA2 includes protruding patterns CP and cut-out portions CG, which are formed by removing a portion of the display panel 300 through photo etching process In each of the cut-out portions CG, the substrate SUB, the pixel circuit layer PCL, and the encapsulation layer TFEL may be removed by photo etching process, and the corresponding space may be filled with the first coupling layer 401 as described above, and each of the protruding patterns CP may include a substrate SUB, a pixel circuit layer PCL, a light emitting element layer EML, and an encapsulation layer TFEL.

In an embodiment, the second dam structure DAM2 may include a first sub dam SDAM1' formed of a same material as that of the second planarization layer 160, a second sub dam SDAM2' formed of a same material as that of the barrier layer 161, and a third sub dam SDAM3' formed of a same material as that of the bank 180.

A dam hole DMH may be disposed inside the second dam structure DAM2. When a second light emitting layer 372 is formed in the second pixel area PXA2 by using the same mask as that of a second common electrode 373, a structure for cutting the second light emitting layer 372 is required like the dam hole DMH.

The dam hole DMH may have an undercut shape. The undercut-shaped hole refers to a hole in which a size of an entrance is smaller than that of a bottom or a hole in which the size of the entrance is smaller than that of an area between the entrance and the bottom. The undercut-shaped hole may be similar to a jar shape or a shape of eaves of a roof. For example, the entrance of the dam hole DMH may be defined by the barrier layer 161. A lower surface of the barrier layer 161 disposed on the second planarization layer 160 may not be covered by the second planarization layer 160. As a result, the size of the entrance of the dam hole DMH may be smaller than that of the area between the entrance and the bottom of the dam hole DMH.

In an embodiment, a first floating pattern FP1, a second floating pattern FP2, and the first encapsulation inorganic layer 191 may be disposed in the dam hole DMH, and the encapsulation organic layer 192 may be filled in the dam hole DMH. At this time, a step coverage of the second light emitting layer 372 and the second common electrode 373 is not good. Therefore, when the dam hole DMH has an undercut shape, the second light emitting layer 372 and the second common electrode 373 may not be disposed on a sidewall of the dam hole DMH. Therefore, the second light emitting layer 372 and the second common electrode 373 may be disconnected in the dam hole DMH. The step coverage indicates that a film deposited by a predetermined deposition method is formed to be continuously connected even in a portion where a step difference is formed, like a stair.

The first floating pattern FP1 may be disposed on the first planarization layer 150 in the dam hole DMH. The first floating pattern FP1 may be a residual layer of the second light emitting layer 372, which is disconnected from a body of the second light emitting layer 372. The first floating pattern FP1 may be made of the same material as that of the second light emitting layer 372. However, when the size of the dam hole DMH is small, the first floating pattern FP1 may not be present.

The second floating pattern FP2 may be disposed on the first floating pattern FP1 in the dam hole DMH. The second floating pattern FP2 may be a residual layer of the second common electrode 373, which is disconnected from a body of the second common electrode 373. The second floating pattern FP2 may be made of the same material as that of the second common electrode 373. However, when the size of the dam hole DMH is small, the second floating pattern FP2 may not be present.

The encapsulation layer TFEL may be disposed on the light emitting element layer EML. The first encapsulation inorganic layer 191 may cover upper surfaces and sides of the second dam structure DAM2, the dam hole DMH, and the light emitting element layer EML, and a side of the pixel circuit layer PCL. The encapsulation organic layer 192 may be disposed in a space defined by the second dam structure DAM2 on the first encapsulation inorganic layer 191. The encapsulation organic layer 192 may be disposed inside without departing from the space defined by the second dam structure DAM2 due to a structure of the dam hole DMH and the second dam structure DAM2 and surface tension of the encapsulation organic layer 192. The encapsulation organic layer 192 may be disposed on the light emitting element layer EML such that a portion of the first encapsulation inorganic layer 191 or the second encapsulation inorganic layer 193 may be prevented or substantially prevented from being punctured to prevent or substantially prevent the light emitting element layer EML from being damaged due to permeation of moisture or oxygen.

The first touch inorganic layer TINS1 and the second touch inorganic layer TINS2 may be disposed on the encapsulation layer TFEL, but are not limited thereto. In some embodiments, the first touch inorganic layer TINS1 and the second touch inorganic layer TINS2 may be omitted.

The second coupling layer 402 may be disposed on the first coupling layer 401 and the protruding pattern CP. In an embodiment, a lower surface of the second coupling layer 402 may be directly in contact with the upper surface of the first coupling layer 401 disposed in the cut-out portion CG and the upper surface of the protruding pattern CP. In an embodiment, an upper surface of the second coupling layer 402 may be directly in contact with a lower surface of the cover window CW, and may have the same area and shape as those of the lower surface of the cover window CW.

In an embodiment, the second coupling layer 402 may include an acrylic optical transparent adhesive (OCA). Therefore, the second coupling layer 402 is optically transparent, and may prevent or substantially prevent visibility of the display device from being reduced as light emitted from the light emitting portion of the protruding pattern CP of the display panel 300 is shielded by the second coupling layer 402. Also, the second coupling layer 402 may adhere the first coupling layer 401 and the protruding pattern CP, which are disposed on the lower surface of the second coupling layer 402, to the cover window CW disposed on the upper surface of the second coupling layer 402.

The cover window CW may be disposed on the second coupling layer 402.

Figure 10:
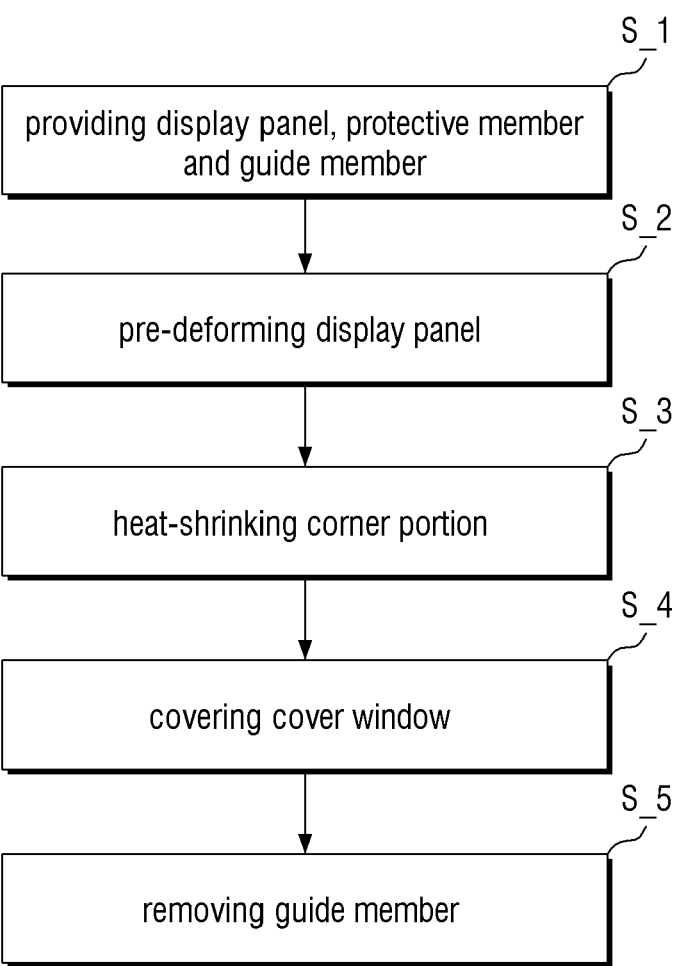
FIG. 10 is a flow chart illustrating a method of manufacturing a display device according to an embodiment of the present disclosure.

FIG. 10 is a flow chart illustrating a method of manufacturing a display device according to an embodiment of the present disclosure.

Figure 11:
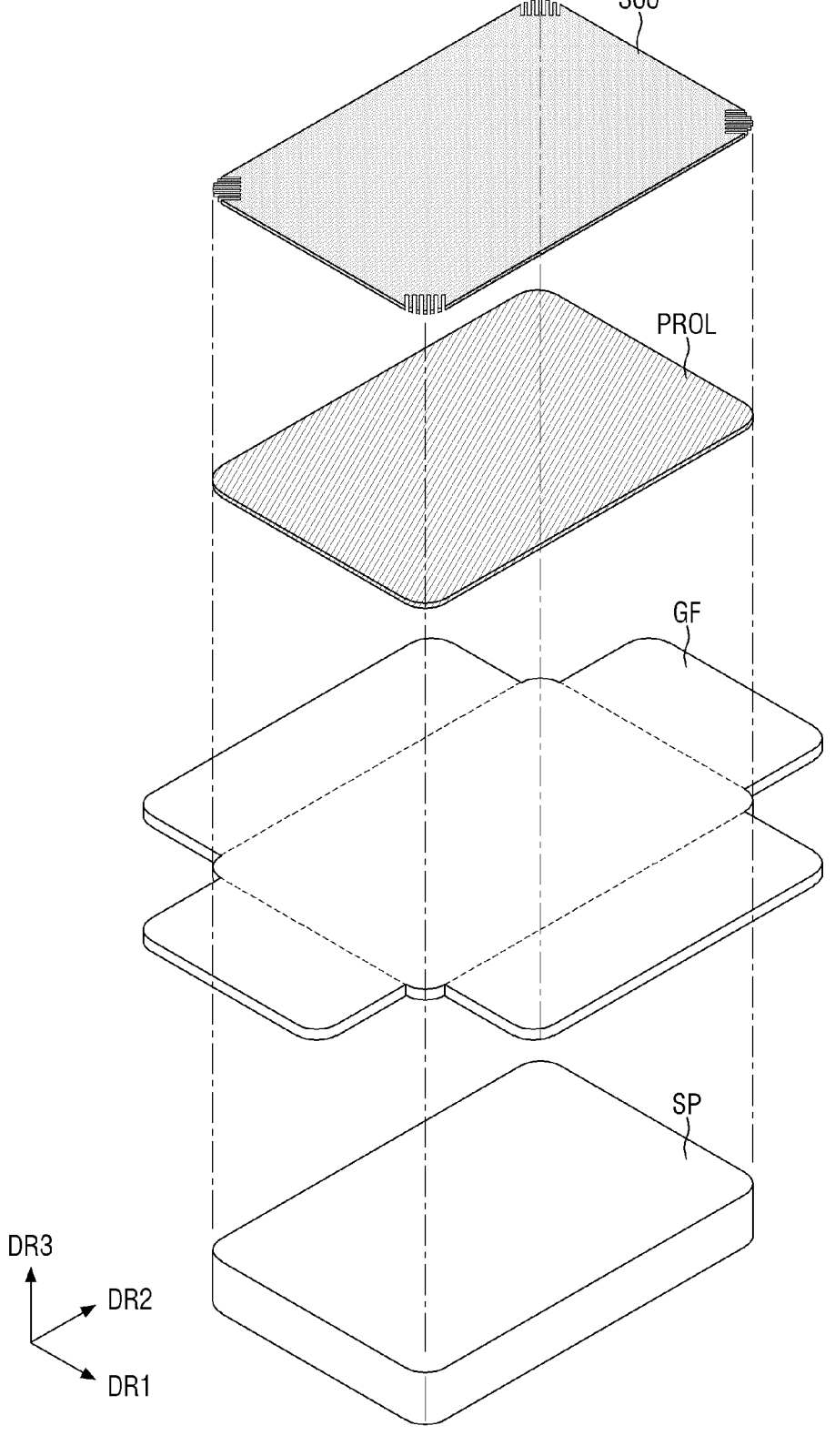
FIGS. 11 to 18 are schematic views illustrating a method of manufacturing a display device according to an embodiment of the present disclosure.

Referring to FIG. 10 and in conjunction with, e.g., FIGS. 1 and 11, in an embodiment, a manufacturing method of the display device 10 may include a step S_1 of providing a display panel 300, a protective member PROL, and a guide member GF, a step S_2 of pre-deforming the display panel 300, a step S_3 of heat-shrinking the corner portion, a step S_4 of covering the cover window CW, and a step S_5 of removing the guide member GF.

FIGS. 11 to 18 are schematic views illustrating a method of manufacturing a display device according to an embodiment of the present disclosure.

The manufacturing method of the display device 10 (see, e.g., FIG. 1) will be described in detail with reference to the flow chart of FIG. 10 and the drawings shown in FIGS. 11 to 18.

Figure 12:
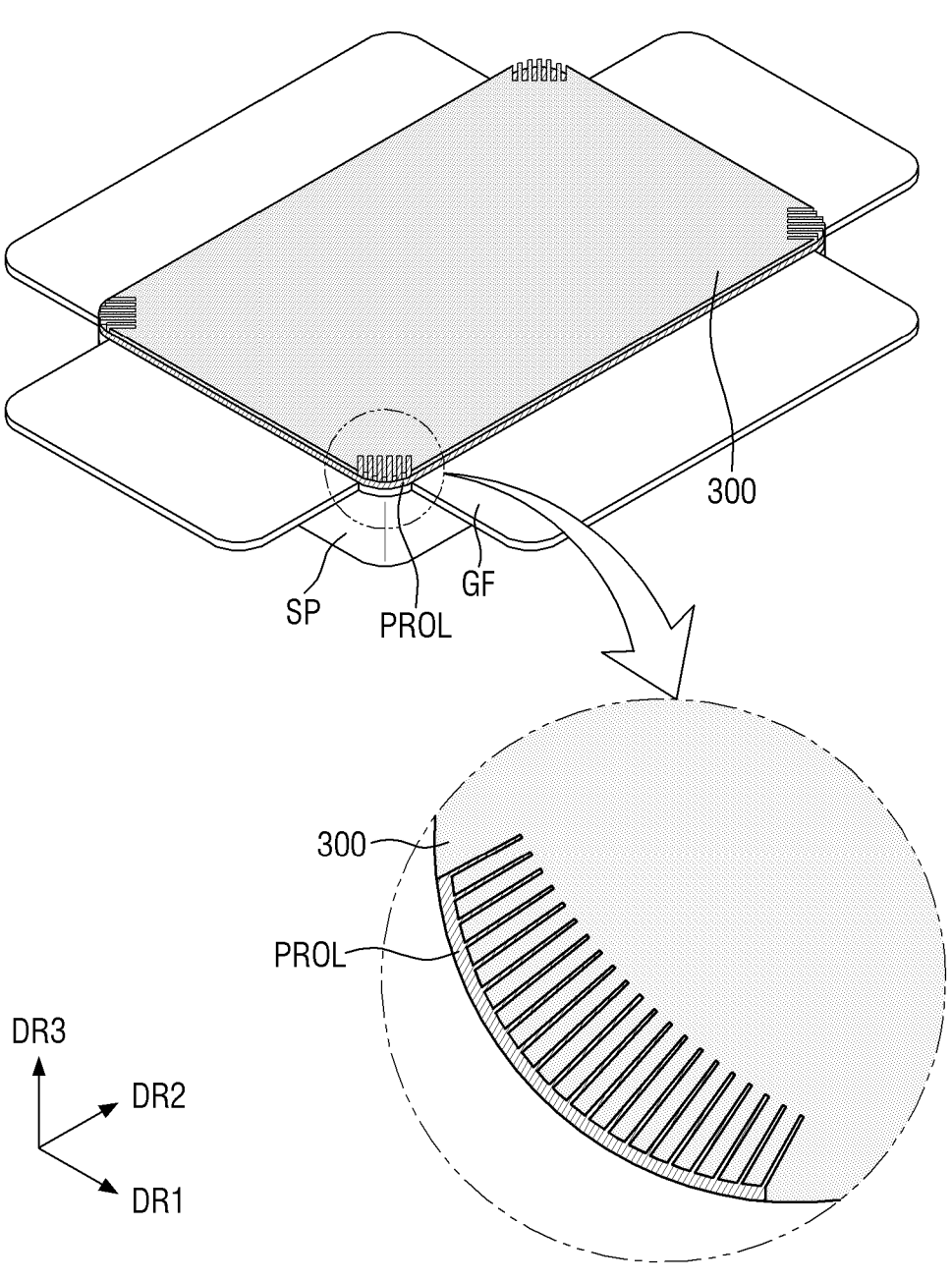

Referring to FIGS. 11 and 12, in an embodiment, the step S_1 (see FIG. 10) of providing the display panel 300, the protective member PROL, and the guide member GF may include stacking the protective member PROL on a lower surface of the display panel 300, stacking the guide member GF on a lower surface of the protective member PROL, and disposing the display panel 300, the protective member PROL, and the guide member GF on a silicon pad SP.

The display panel 300, the protective member PROL, and the guide member GF may be the same as those described above, and, thus, further description thereof will be omitted. In the step of disposing the display panel 300, the protective member PROL, and the guide member GF on the silicon pad SP, a center of the lower surface of the guide member GF and a center of the silicon pad SP are matched with each other such that upper and lower sides and left and right sides of the guide member GF, which are protruded from the protective member PROL and the display panel 300, are spaced apart from the upper surface of the silicon pad SP. The silicon pad SP may serve to prevent or substantially prevent pressure from being concentrated on a specific portion in the process of pre-deforming the display panel 300 by using the guide member GF as described below.

Figure 13:
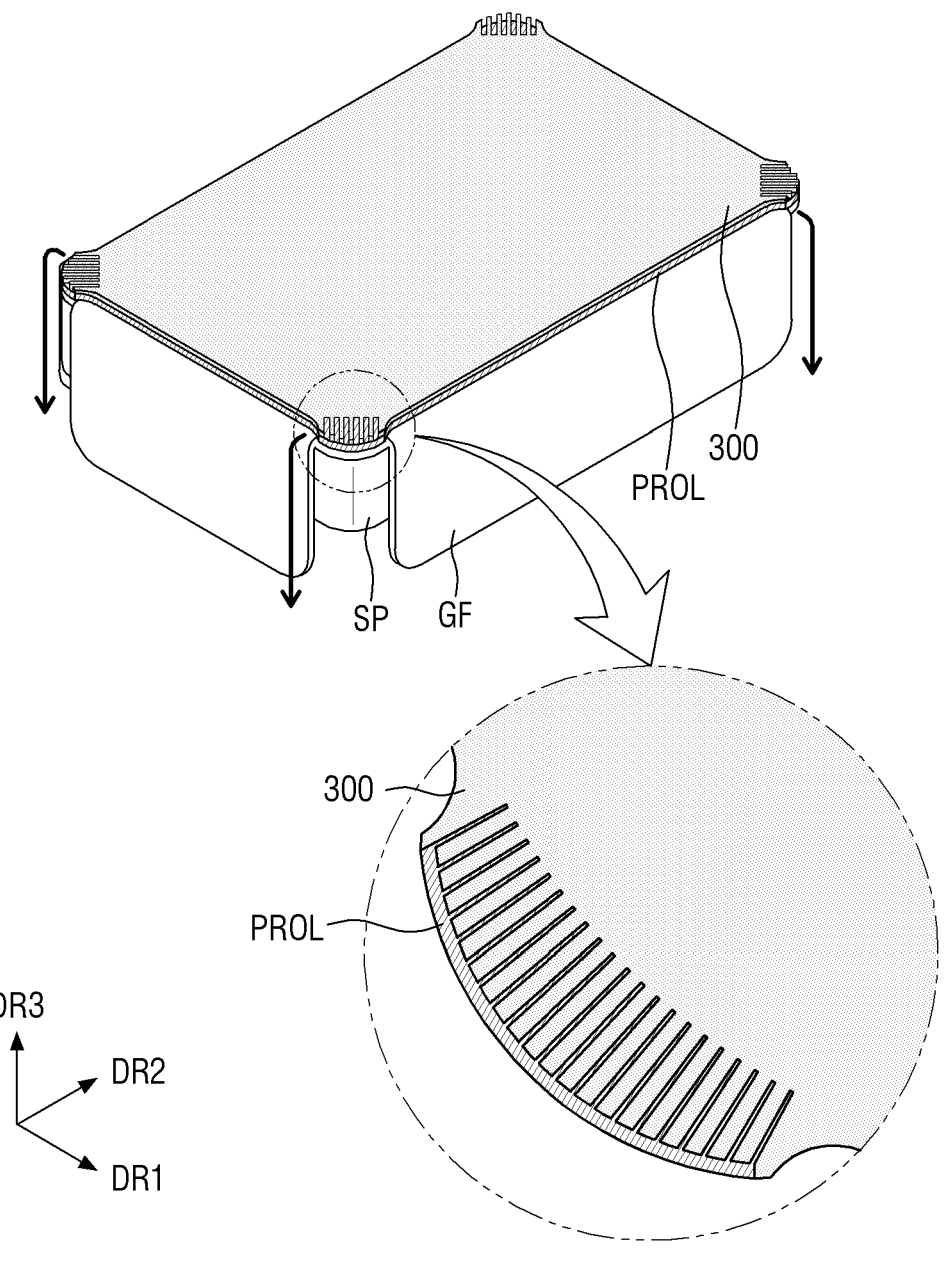

Referring to FIG. 13, the step S_2 (see FIG. 10) of pre-deforming the display panel 300 is a step of deforming the shape of the display panel 300 and the protective member PROL by pulling down the upper and lower sides and the left and right sides of the guide member GF, which are protruded from the protective member PROL and the display panel 300. In an embodiment, the guide member GF, the protective member PROL and the display panel 300 may be coupled to one another by a coupling layer. The upper and lower sides and the left and right sides of the guide member GF, which are protruded from the protective member PROL and the display panel 300, are pulled down and thus are forced downward. Therefore, the upper and lower sides and the left and right sides of the display panel 300 and the protective member PROL, which are coupled to the guide member GF by the coupling layer, are forced together, and, thus, the upper and lower sides and the left and right sides of the protective member PROL and the display panel 300 may be bent as shown in FIG. 4. On the other hand, the corner portions of the display panel 300, the guide member GF, and the protective member PROL are relatively less forced than their upper and lower sides and left and right sides, and may be more protruded in the direction of each corner than the upper and lower sides and the left and right sides.

Figure 14:
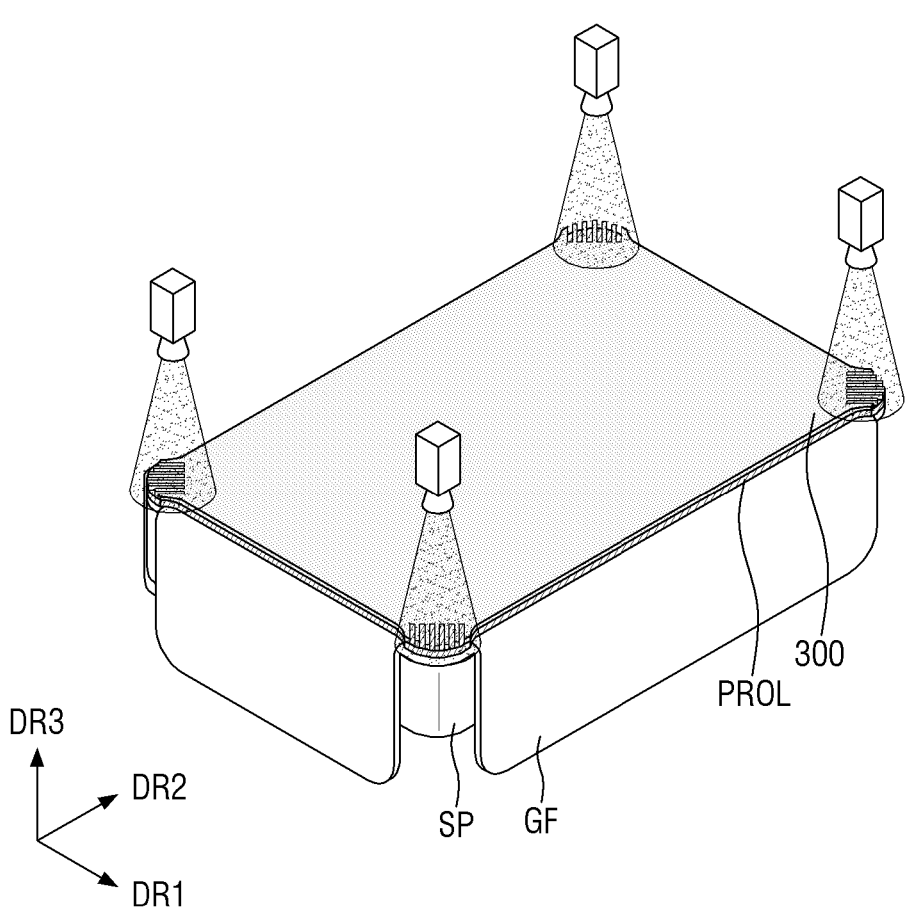
Figure 15:
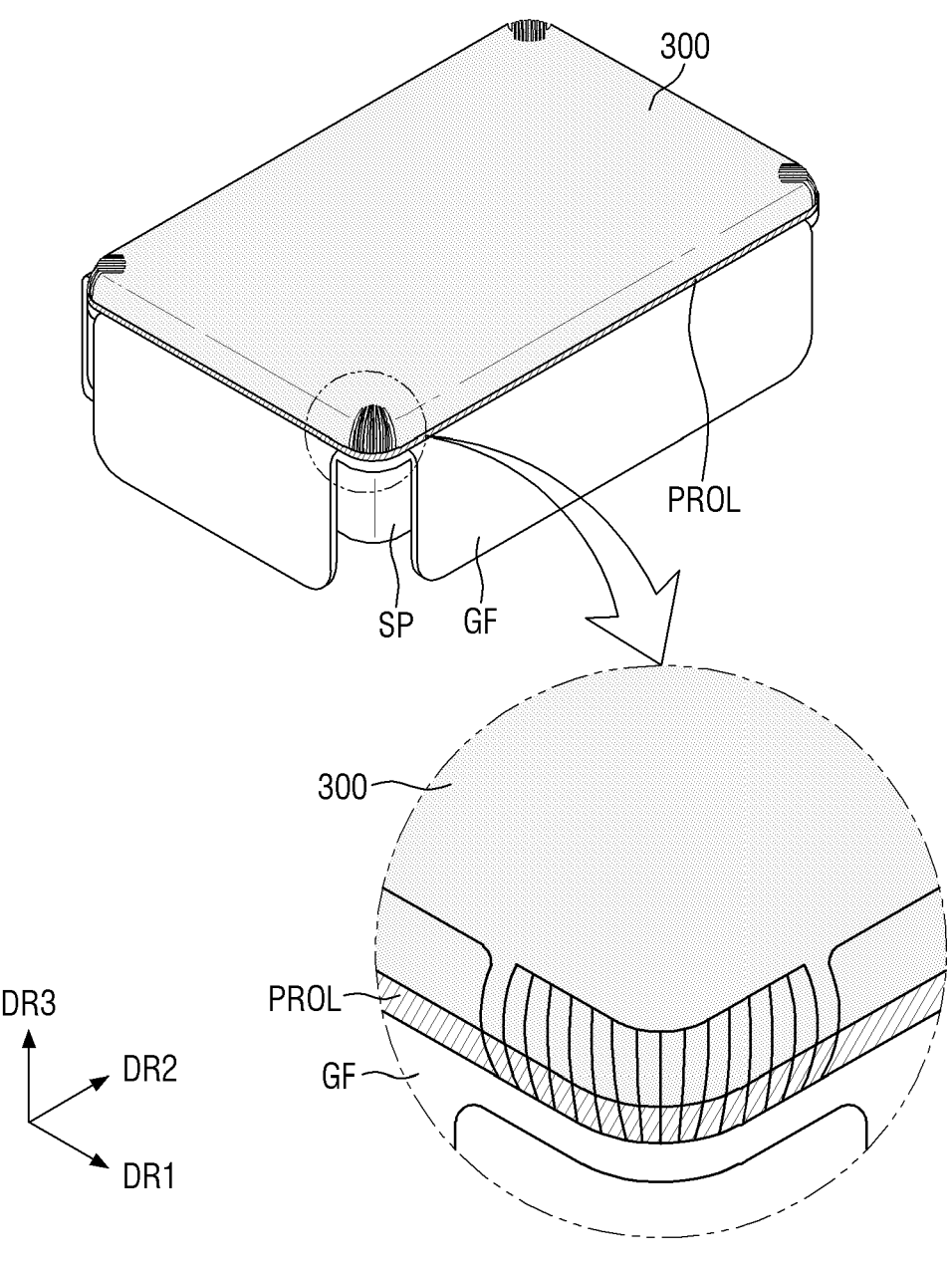

Referring to FIGS. 14 and 15, the step S_3 (see FIG. 10) of heat-shrinking the corner portion may be a step of shrinking the corner portion of the display device 10 (see, e.g., FIG. 1) by applying heat to the corner portion of the display device 10. In an embodiment, light emitted from the LED may be irradiated to the corner portion of the display device 10 to increase the temperature of the protective member PROL. In an embodiment, the protective member PROL includes a stretched polyester as described above, and when the temperature of the protective member PROL is increased, the stretched polyester returns to its original shape and the protective member PROL may be shrunk. Since the protective member PROL is coupled to the display panel 300 and the guide member GF by the coupling layer, when the protective member PROL is shrunk, the display panel 300 and the guide member GF, which are coupled to the protective member PROL, may be also shrunk, and, thus, in an embodiment, the entire corner portions of the display device 10 may be shrunk.

Since the side of the display device 10 adjacent to each corner portion is bent downward through the step S_2 of pre-deforming the display panel 300, the corner portion may be shrunk in a direction in which the distance between molecules of the protective member PROL is narrowed. Therefore, the corner portion may be shrunk in the same direction as a center direction in the direction in which the adjacent sides of the display device 10 are bent.

Shear stress for shrinking the cut-out portion CG (see FIG. 7) of the display panel 300 at the corner portion may be smaller than that for shrinking the protruding pattern CP. Therefore, even though the protective member PROL applies the same shear stress to the protruding pattern CP and the cut-out portion CG, which are disposed thereon, while being shrunk, a portion in which the cut-out portion CG is disposed may be more shrunk than a portion in which the protruding pattern CP is disposed. Therefore, an interval between the cut-out portions CG may be narrowed and an interval between the plurality of protruding patterns CP may be narrowed.

The corner portion of the display device 10 may be shrunk by irradiating light emitted from LED thereto as described above, whereby a difference between a shape and a curvature of the lower surface of the cover window CW (see, FIG. 16) to be disposed on the upper surface of the display panel 300 and a shape and a curvature of the upper surface of the display panel 300 may be mitigated.

Figure 16:
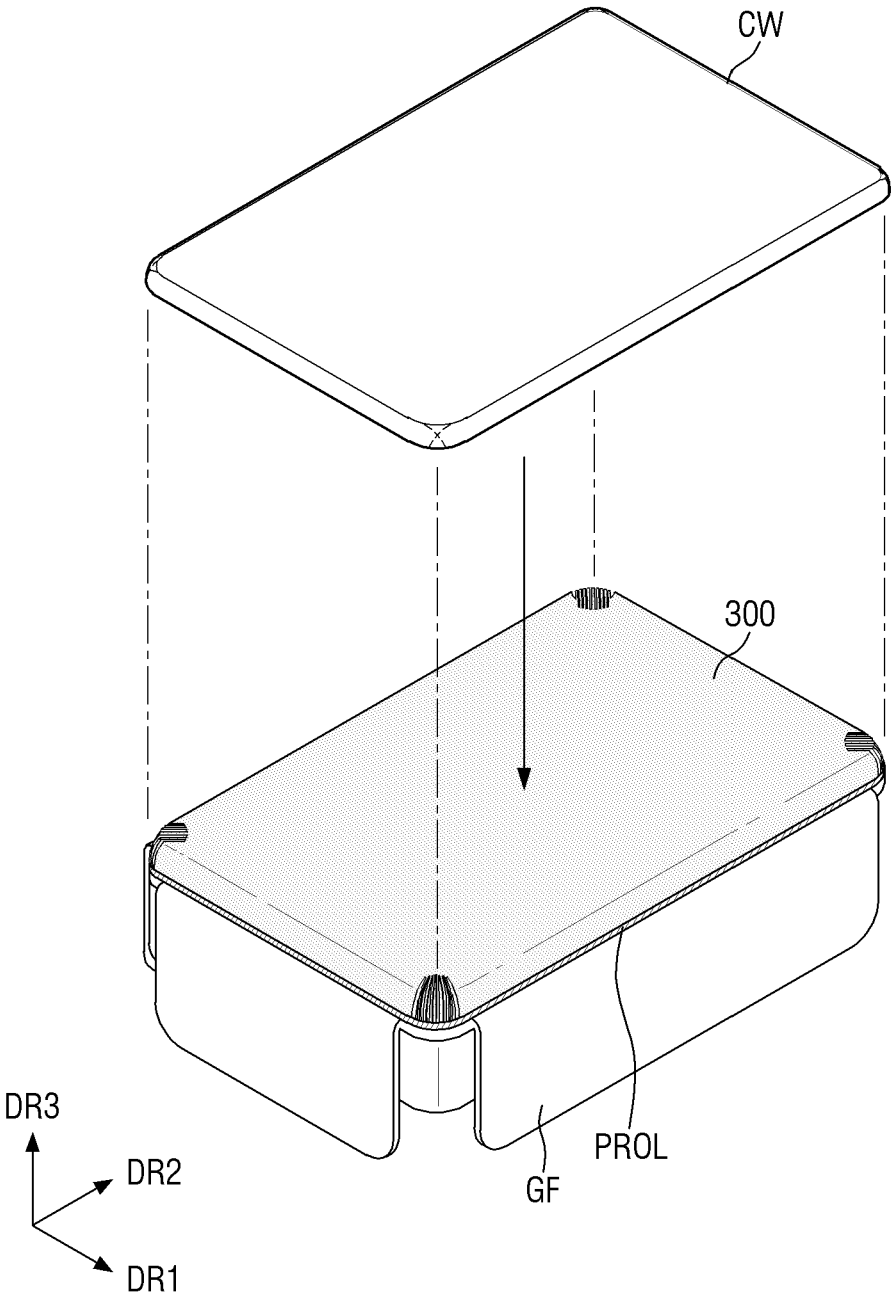

Referring to FIG. 16, the step S_4 (see FIG. 10) of covering the cover window CW may be a step of disposing the cover window CW on an upper surface of the display panel 300. In an embodiment, the cover window CW including upper and lower sides having a first curvature, left and right sides having a second curvature, and a corner portion having the first curvature and the second curvature may be provided, wherein the upper and lower sides meet the left and right sides in the corner portion. The cover window CW may be disposed on the upper surface of the display panel 300 such that upper and lower sides, left and right sides, and corner portions of the display panel 300 correspond to the upper and lower sides, the left and right sides, and the corner portions of the cover window CW. A space between the cover window CW and the display panel 300 may be minimized or reduced by applying pressure to the cover window CW in the third direction DR3 toward the display panel 300. The display panel 300 that is not completely deformed in the step S_2 of pre-deforming the display panel 300 and the step S_3 of shrinking the corner portion as shown in FIG. 10 may be deformed in the same shape as that of the lower surface of the cover window CW by applying pressure onto the upper surface of the cover window CW. A space between the lower surface of the cover window CW and the upper surface of the display panel 300 may not be formed, but is not limited thereto. For example, there may be fine bubbles between the upper surface of the display panel 300 and the lower surface of the cover window CW in at least a portion, and there may be a small space between several protruding patterns CP of the corner portion.

Figure 17:
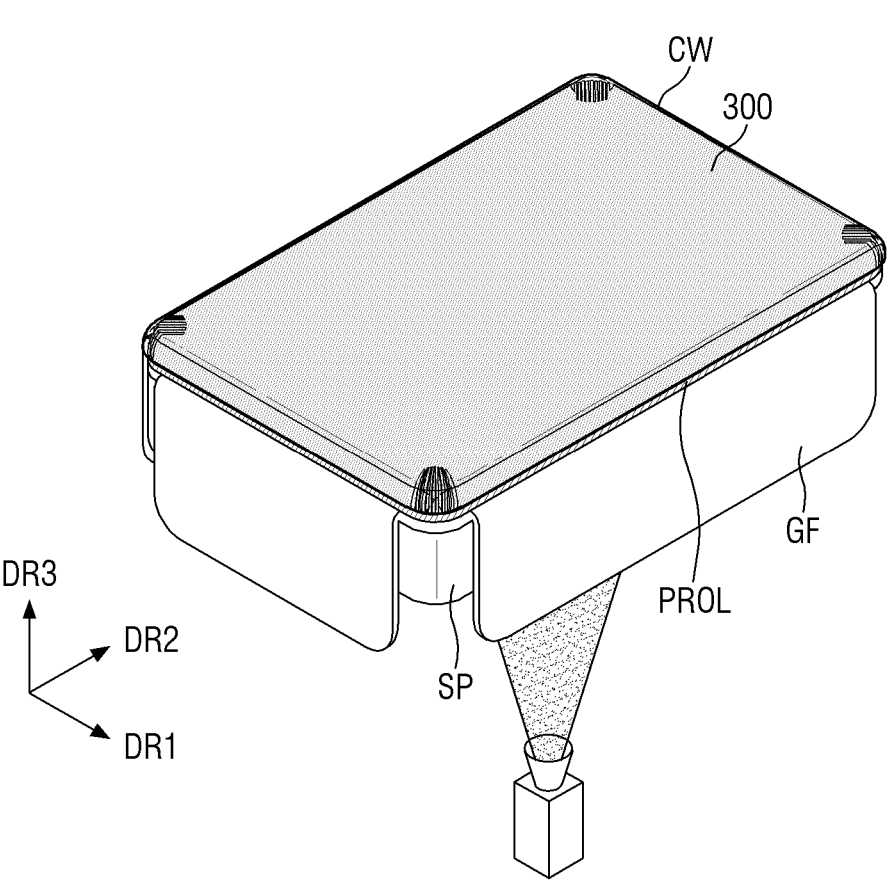
Figure 18:
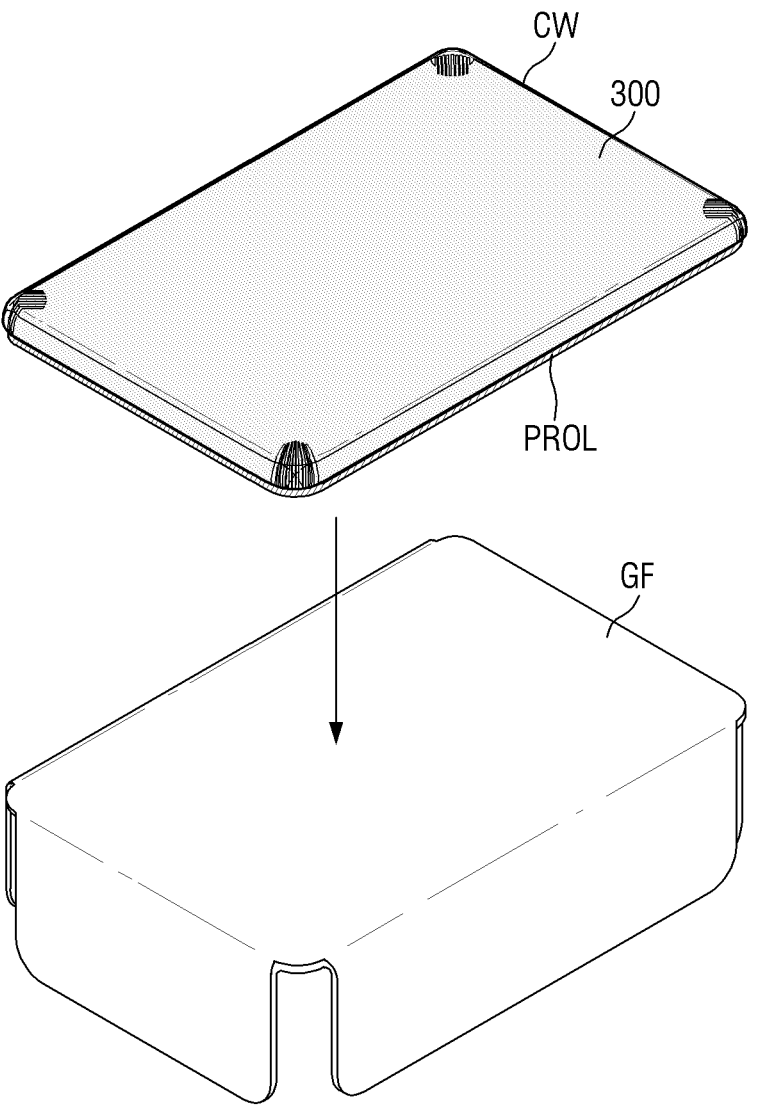

Referring to FIGS. 17 and 18, in an embodiment, the step S_5 (see FIG. 10) of removing the guide member GF may be a step of removing the guide member GF by irradiating ultraviolet rays to an interface between the protective member PROL and the guide member GF. In an embodiment, the coupling layer for coupling the protective member PROL with the guide member GF between the protective member PROL and the guide member GF may be a UV-curable adhesive. The UV-curable adhesive has a high adhesive force but may be cured when ultraviolet rays are irradiated thereto, such that the adhesive force may be weakened. Therefore, the UV-curable adhesive may be cured by irradiating ultraviolet rays to the interface between the protective member PROL and the guide member GF, which are adhered to each other by the UV-curable adhesive. The UV-curable adhesive may be cured to weaken the adhesive force between the protective member PROL and the guide member GF, and then the guide member GF may be removed from the protective member PROL.

Figure 19:
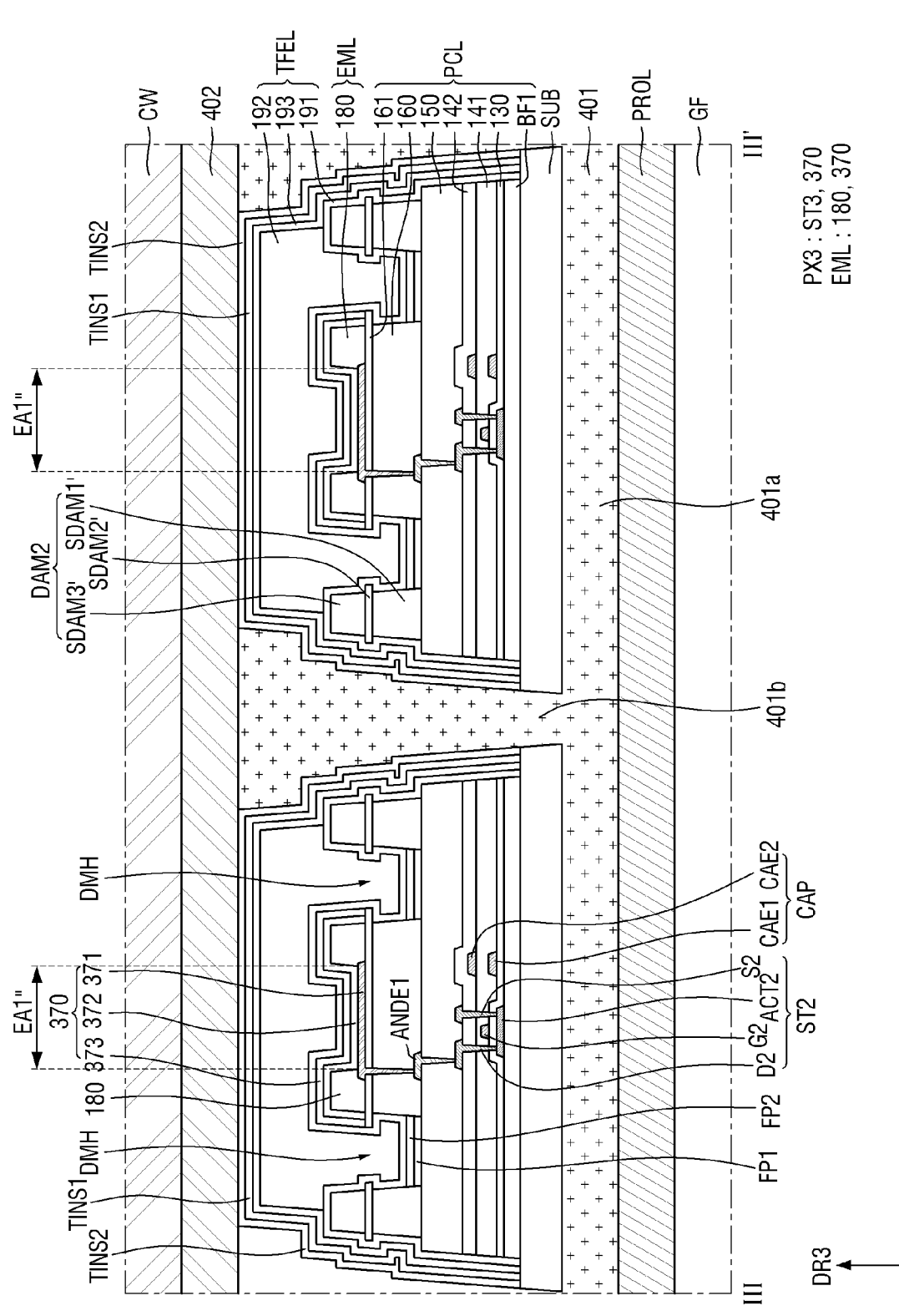
FIG. 19 is a cross-sectional view illustrating a display device according to an embodiment.
Figure 20:
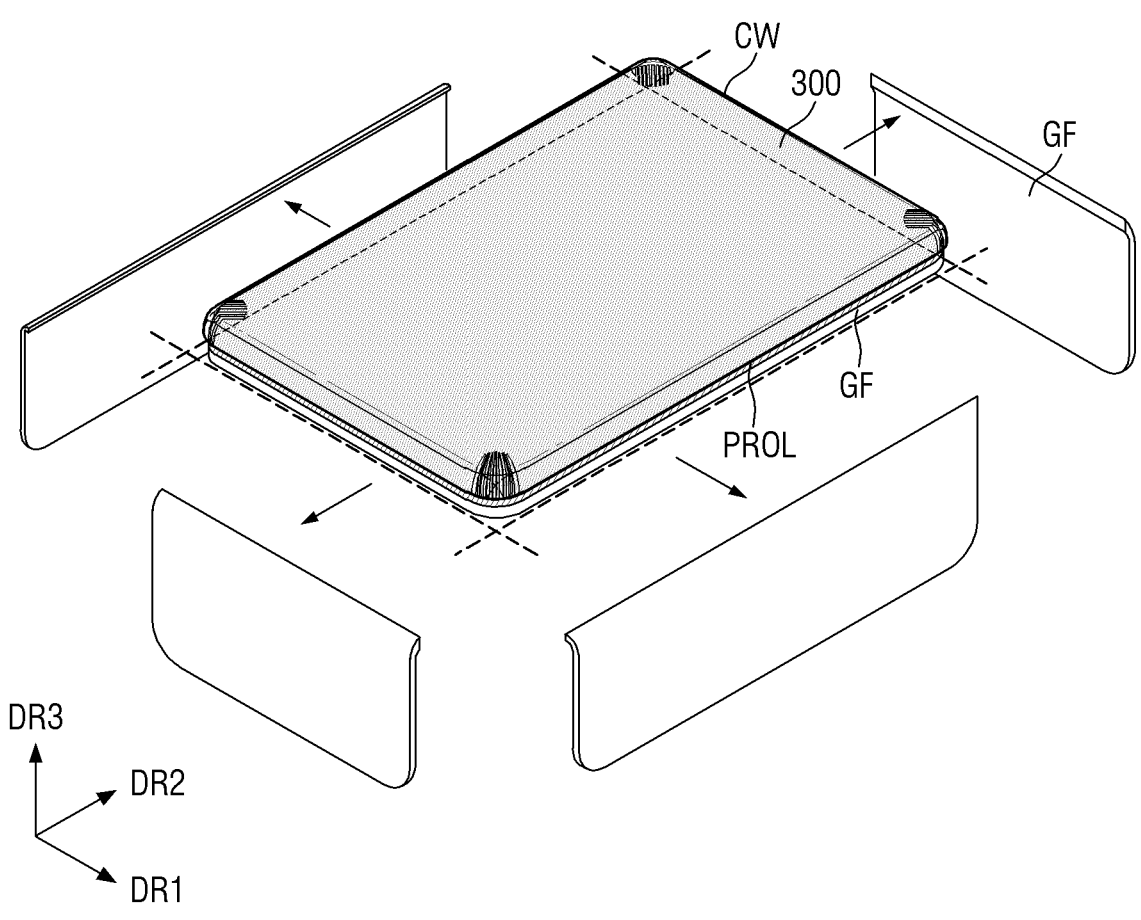
FIG. 20 is a schematic view illustrating a method of manufacturing a display device according to an embodiment of the present disclosure.

FIG. 19 is a cross-sectional view illustrating a display device according to an embodiment. FIG. 20 is a schematic view illustrating a method of manufacturing a display device according to an embodiment of the present disclosure.

The display device of FIG. 19 according to an embodiment of the present disclosure is different from the display device 10 (see, e.g., FIG. 1) of FIG. 9 in that the protective member PROL includes polydimethylsiloxane (PDMS) or elastic polyurethane (EPU), and the guide member GF is disposed on the lower surface of the protective member PROL.

The manufacturing method of the display device according to the present embodiment is different from the manufacturing method of the display device 10 of FIG. 18 in that the guide member GF is not completely removed, and the upper and lower sides and the left and right sides of the guide member GF, which are protruded from the protective member PROL and the display panel 300, are only cut off.

Referring to FIG. 19, the protective member PROL may include polydimethylsiloxane having elasticity. Therefore, stress applied from the corner portion having both the curvature of the upper or lower side and the curvature of the left or right side to the protective member PROL and the display panel 300 disposed on the upper surface of the protective member PROL may be mitigated.

In an embodiment, the guide member GF may include a stretched polyester. Therefore, the guide member GF may be shrunk when heat is applied thereto, in the same manner as the protective member PROL in an embodiment described above. In some embodiments, at least a portion of the guide member GF disposed on the lower surface of the protective member PROL may remain without being fully removed. As the shrunk guide member GF remains without being removed, the corner portion of the display device may be prevented or substantially prevented from returning to its original shape when the guide member GF is removed.

An area in which the guide member GF is disposed to overlap the first pixel area PXA1 (see FIG. 7) of the display panel in the thickness direction is defined as a first guide area, and an area in which the guide member GF is disposed to overlap the second pixel area PXA2 (see FIG. 7) of the display panel in the thickness direction is defined as a second guide area. The guide member GF may include polyester in both the first guide area and the second guide area, but is not limited thereto. For example, the guide member GF may include polyester in the second guide area, whereby the corresponding area may be only shrunk by heat. In an embodiment, even in the second guide area, the portion including polyester may have a plurality of rod shapes, and the other portions may not include polyester.

As the protective member PROL includes polydimethylsiloxane, and the guide member GF includes polyester, a shrinkage characteristic by heat of the guide member GF may be greater than that of the protective member PROL. In an embodiment, when heat having a temperature of 80° C. to 100° C. is applied to the guide member GF by using LED or the like for about 10 seconds, the guide member GF may exhibit a shrinkage characteristic of 70% or more. For example, the guide member GF may exhibit a shrinkage characteristic of 75% when heat having a temperature of 90° C. is applied to the guide member GF for 10 seconds.

Referring to FIG. 20, in the manufacturing method of the display device according to this embodiment, only the upper and lower sides and the left and right sides of the guide member GF, which is protruded from the protective member PROL and the display panel 300, may be cut off. As a portion of the guide member GF remains on the lower surface of the protective member PROL, a four-layered structure of the guide member GF, the protective member PROL, the display panel 300, and the cover window CW may be formed from the bottom of the protective member PROL. The guide member GF, which remains without being removed, may mitigate an impact on the lower surface of the display device together with the protective member PROL, and may contribute to maintaining the shape of the display device.

Figure 21:
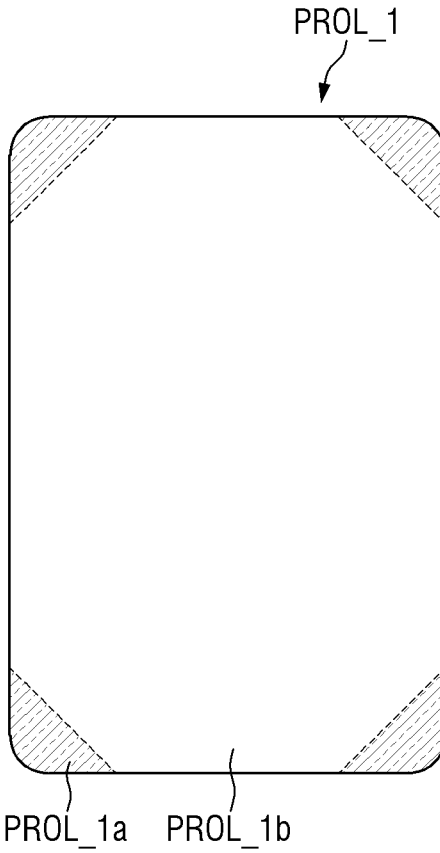
FIG. 21 is a plan view illustrating a protective member of a display device according to an embodiment.

FIG. 21 is a plan view illustrating a protective member of a display device according to an embodiment.

The display device according to this embodiment is different from the display device 10 according to the embodiment of FIGS. 1 to 9 in that components constituting a protective member PROL_1 are different depending on each area of the protective member PROL_1.

The protective member PROL_1 may include a shrinkage portion PROL_1a and a non-shrinkage portion PROL_1b. The shrinkage portion PROL_1a may be disposed in the second protective area, and the non-shrinkage portion PROL_1b may be disposed in the first protective area. In an embodiment, the non-shrinkage portion PROL_1b may include polyethylene terephthalate (PET). The non-shrinkage portion PROL_1b may not be shrunk even though heat is applied thereto. In an embodiment, the shrinkage portion PROL_1a may include polyester. Therefore, the shrinkage portion PROL_1a may be heat-shrunk when heat is applied thereto.

In an embodiment, in the protective member PROL_1, the non-shrinkage portion PROL_1b is disposed in the first protective area to contribute to maintaining the entire shape of the display device, and the shrinkage portion PROL_1a including polyester is disposed in the second protective area to be able to be shrunk by heat, whereby the shape of the corner portion of the display device may be formed as designed, and reliability in lamination of the display panel 300 and the cover window CW may be ensured.

In some embodiments, the shrinkage portion PROL_1a of the protective member PROL_1 may have various shapes. For example, the shrinkage portion PROL_1a may be wider than the second protective area so as to sufficiently cover the second protective area, but the shrinkage portion PROL_1a may be narrower than the second protective area. In addition, in accordance with the shape of the display panel 300 (see, e.g., FIG. 20) disposed on the upper surface of the protective member PROL_1, the shrinkage portion PROL_1a may be disposed on the protective member PROL_1 disposed to overlap the protruding pattern CP (see FIG. 6) in the third direction DR3, and the non-shrinkage portion PROL_1b may be disposed on the protective member PROL_1 disposed to overlap the cut-out portion CG (see FIG. 7).

Figure 22:
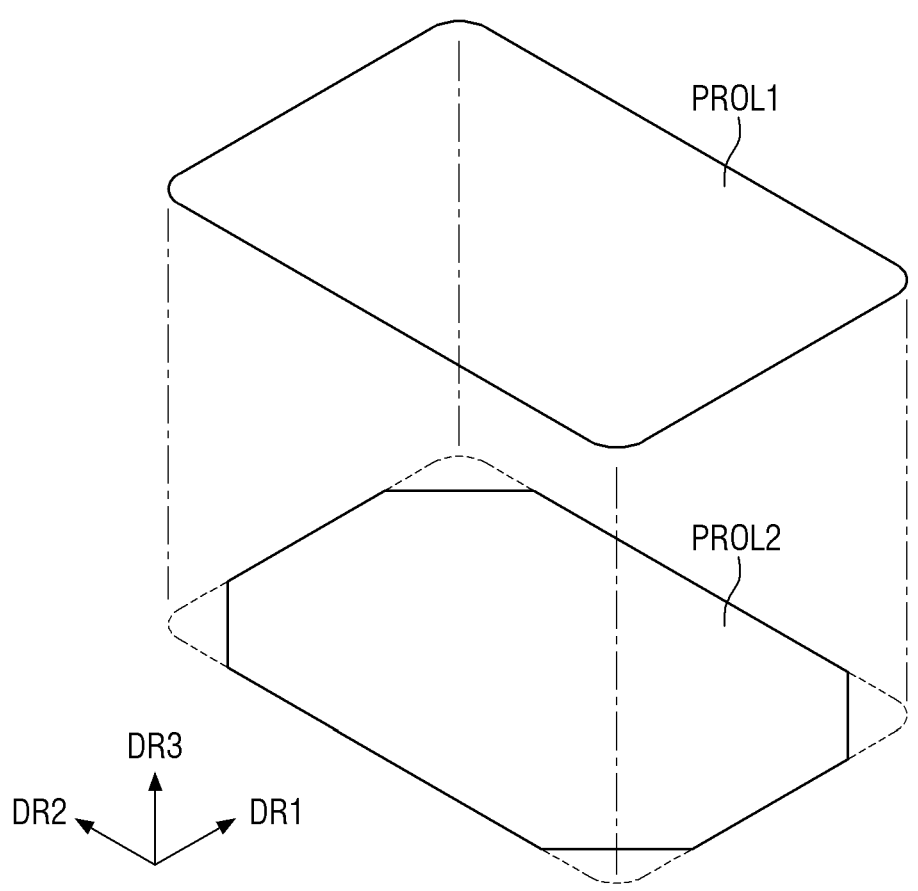
FIG. 22 is a schematic view illustrating a protective member of a display device according to an embodiment.

FIG. 22 is a schematic view illustrating a protective member of a display device according to an embodiment.

The display device according to this embodiment is different from the display device 10 according to the embodiment of FIGS. 1 to 9 in that the protective member PROL has a double-layered structure.

The protective member PROL may include a first protective member PROL1 disposed on a lower surface of the display panel 300 (see, e.g., FIG. 20), and a second protective member PROL2 disposed on a lower surface of the first protective member PROL1. In an embodiment, the first protective member PROL1 may include polyester in the same manner as the protective member PROL described with reference to FIGS. 1 to 12.

In an embodiment, the second protective member PROL2 may exist only in an area corresponding to the first protective area, and a portion of the second protective member PROL2, which corresponds to the second protective area, may have a cut-out shape. In other words, It has a cut octagonal shape in an area corresponding to the second protective area. In an embodiment, the second protective member PROL2 may include polyethylene terephthalate (PET). The second protective member PROL2 disposed on the lower surface of the first protective member PROL1 may include a polyethylene terephthalate (PET) having low elasticity to prevent or substantially prevent the first protective area other than the second protective area corresponding to the corner portion from being shrunk by heat when heat is applied to the first protective member PROL1. Therefore, the first protective member PROL1 may contribute to manufacturing the shape of the corner portion of the display device, and the second protective member PROL2 may contribute to maintaining the shape of the portion other than the corner portion.

Features of various embodiments of the disclosure may be combined partially or totally. As will be clearly appreciated by those skilled in the art, technically various interactions and operations are possible. Also, various embodiments can be practiced individually or in combination.

In concluding the detailed description, those skilled in the art will appreciate that many variations and modifications can be made to the described embodiments without substantially departing from the principles of the invention. Therefore, the disclosed embodiments of the invention are used in a generic and descriptive sense and not for purposes of limitation.

What is claimed is:

1. A display device, wherein the display device comprises:
   a display panel comprising a first pixel area, and a second pixel area comprising a plurality of protruding patterns protruded outward from the first pixel area at a corner portion having both a curvature of left or right side and a curvature of upper or lower side of the display device, and a cut-out portion defined by a space between the plurality of protruding patterns; and
   a protective member on a lower surface of the display panel,
   wherein the protective member comprises a first protective area overlapping with the first pixel area of the display panel in a thickness direction, and a second protective area overlapping with the second pixel area of the display panel in the thickness direction, and
   a density per unit volume of at least a region of the second protective area overlapping with a protruding pattern of the plurality of protruding patterns in the thickness direction is greater than that of the first protective area.

2. The display device of claim 1, wherein the protective member has a heat shrinkage characteristic of 70% to 90% in an environment of 80° C. to 100° C.

3. The display device of claim 2, wherein an upper surface of the protective member is directly in contact with the lower surface of the display panel.

4. The display device of claim 3, wherein a distance between molecules of the second protective area of the protective member is shorter than that of the first protective area.

5. The display device of claim 2, wherein the display device further comprises a cover window on an upper surface of the display panel, and a guide member is on a lower surface of the protective member,
   wherein the protective member comprises polydimethylsiloxane or elastic polyurethane.

6. The display device of claim 5, wherein a heat shrinkage characteristic of the guide member is greater than that of the protective member.

7. A display device, wherein the display device comprises:
   a display panel comprising a first pixel area, and a second pixel area comprising a plurality of protruding patterns protruded outward from the first pixel area at a corner portion having both a curvature of left or right side and a curvature of upper or lower side of the display device, and a cut-out portion defined by a space between the plurality of protruding patterns; and
   a protective member on a lower surface of the display panel,

US 12,604,617 B2

27                                                      28 wherein the protective member comprises polyester, wherein the protective member comprises a first protective area overlapping with the first pixel area of the display panel in a thickness direction, and a second protective area overlapping with the second pixel area of the display panel in the thickness direction, and wherein the second protective area has a heat shrinkage characteristic greater than that of the first protective area.

8. The display device of claim 7, wherein the protective member comprises a first protective area overlapping with the first pixel area of the display panel in a thickness direction, and a second protective area overlapping with the second pixel area of the display panel in the thickness direction, and both the first protective area and the second protective area comprise polyester.

9. The display device of claim 8, wherein the display device further comprises:

a cover window on an upper surface of the display panel; and an auxiliary protective member on a lower surface of the protective member, being directly in contact with the first protective area, having a cut octagonal shape in an area corresponding to the second protective area, and comprising polyethylene terephthalate.

10. The display device of claim 7, wherein the first protective area comprises polyethylene terephthalate, and the second protective area comprises polyester.

11. A display device, wherein the display device comprises:

a display panel comprising a first pixel area, and a second pixel area comprising a plurality of protruding patterns protruded outward from the first pixel area at a corner portion having both a curvature of left or right side and a curvature of upper or lower side of the display device, and a cut-out portion defined by a space between the plurality of protruding patterns; and a protective member on a lower surface of the display panel, wherein the protective member comprises polyester, wherein the protective member comprises a first protective area overlapping with the first pixel area of the display panel in a thickness direction, and a second protective area overlapping with the second pixel area of the display panel in the thickness direction, the first protective area comprises polyethylene terephthalate, and the second protective area comprises polyester, and wherein a portion of the second protective area, which comprises polyester, has a plurality of rod shapes protruded outward from the first protective area, and another portion of the second protective area except the portion comprising polyester comprises polyethylene terephthalate.

12. The display device of claim 11, wherein the portion of the second protective area, which comprises polyester, is located on a lower surface of the cut-out portion, and the another portion of the second protective area except the portion comprising polyester is located on a lower surface of the protruding pattern.

* * * * *